United States Patent
Minamizaki et al.

(10) Patent No.: US 6,411,162 B2
(45) Date of Patent: Jun. 25, 2002

(54) AMPLIFIER DEVICE AND LCD DEVICE

(75) Inventors: Hironori Minamizaki, Kawasaki; Tetsuro Itakura, Tokyo; Tetsuya Saito, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/813,958

(22) Filed: Mar. 22, 2001

(30) Foreign Application Priority Data

Mar. 23, 2000 (JP) ........................................ 2000-82855
Mar. 15, 2001 (JP) ........................................ 2001-74739

(51) Int. Cl.$^7$ ................................................ H03F 3/45
(52) U.S. Cl. ........................ 330/255; 330/264; 349/42
(58) Field of Search ................................. 330/255, 264, 330/267, 269; 349/42, 41

(56) References Cited

U.S. PATENT DOCUMENTS

| | | | | |
|---|---|---|---|---|
| 4,912,425 A | * | 3/1990 | Kobayashi et al. | 330/264 |
| 5,399,992 A | | 3/1995 | Itakura et al. | 330/253 |
| 5,471,171 A | | 11/1995 | Itakura et al. | 330/255 |
| 5,475,343 A | * | 12/1995 | Bee | 330/267 |
| 5,608,352 A | | 3/1997 | Itakura | 330/253 |
| 5,751,186 A | * | 5/1998 | Nakao | 330/255 |
| 5,900,780 A | * | 5/1999 | Hirose et al. | 330/255 |
| 5,900,783 A | | 5/1999 | Dasgupta | 330/264 |

* cited by examiner

*Primary Examiner*—Robert Pascal
*Assistant Examiner*—Khanh V. Nguyen
(74) *Attorney, Agent, or Firm*—Oblon, Spivak, McClelland, Maier & Neustadt, P.C.

(57) ABSTRACT

In an amplifier device, a negative output voltage (−) of a differential amplifier stage corresponding to an input signal voltage (Vin) is supplied to the gate of Output transistor M25 for charging electrical charges to Capacitive load (80). A current corresponding to a positive output voltage (+) of the differential amplifier stage is supplied to Node (A) through which the gate of Output transistor M26 for discharging electrical charges from Capacitive load (80) is connected to Constant current source (4). This current becomes a value (Iy+ΔI) according to the voltage (Vin). By changing the gate voltage of Output transistor M26, it enters ON, and the electrical charges are discharged as a current I3 from Capacitive load (80). The voltage (Vin) is converted to a current by Voltage-current converter (1), and Current-voltage converter (2) then converts this current to a voltage. It is thereby possible to increase the driving ability of Output transistor M26 and to perform a response operation at high speed with low power consumption only by changing the current corresponding to the positive output voltage (+) of the differential pair.

20 Claims, 18 Drawing Sheets

DISCHARGING PERIOD FOR
ELECTRICAL CHARGES

US 6,411,162 B2

AMPLIFIER DEVICE AND LCD DEVICE

CROSS-REFERENCE TO RELATED APPLICATION

This application claims benefit of priority under 35 USC 119 to Japanese Patent Applications No. 2000-82855, filed on Mar. 23, 2000, and No. 2001-74739, filed on Mar. 15, 2001, the entire contents of which are incorporated herein by reference.

BACKGROUND OF THE INVENTION

1. Field of the Invention

The present invention relates to an amplifier device and a Liquid Crystal Display (LCD) device built-in the amplifier device for driving capacitive load such as Liquid Crystal (LC) cells forming the LCD device, and, more particularly, to an amplifier device and the LCD device with a low power consumption.

2. Description of the Related Art

Recently, Liquid Crystal Display (LCD) panels and LCD devices comprising source drivers to drive such the LCD panel in which a plurality of LC cells are arranged in matrix are widely used as display means for displaying images and characters in many kinds of information processing devices.

The principle of the operation of the LCD is as follows:

An arrangement of LC molecules forming a LC cell is switched to another arrangement by applying an electric field to the LC cell in order to change the optical properties of the LC molecules, and an incident light irradiated to the LC cell is thereby modulated. Accordingly, it is possible to display the image on the LCD panel by applying an input signal voltage corresponding to an image signal to the LC cell. Such LCD panel is driven by a plurality of amplifier devices for applying corresponding voltage to each LC cell. The amplifier device considers the LC cell as a capacitive load. The amplifier device charges electrical charges to and discharges them from the LC cell so that the voltage of the capacitive load is set to a desired level. The LCD can thereby display the image.

FIG. 17 is a block diagram showing a configuration of a conventional amplifier device capable of discharging electrical charges from such a capacitive load (as a LC cell) described above. In FIG. 17, an input signal voltage Vin is converted to a current I1 (for example, whose magnitude is approximately 200 to 300 $\mu A$.) by a voltage-current converter 151. This current I1 flows through a transistor T1 in a diode connection. Because both the transistor T1 and a transistor T2 form a current mirror circuit, a current I that is equal in magnitude to that of the current I1 flows through the transistor T2 from a capacitance C (for example, whose magnitude is 100 pF.) that is an equivalent circuit of the capacitive load 80. The electrical charges that have been charged and accumulated in the capacitance C are thereby discharged, so that the voltage of the capacitive load 80 is fallen in level from 5 V to 3 V.

When the capacitance of the capacitance C is large or electrical changes from the capacitive load must be discharged with a high speed, it is necessary to increase the magnitude of the current I flowing through the transistor T2. However, this requirement leads to increase the magnitude of the current I1 that flows through the transistor T1 from the voltage-current converter 151 and thereby causes to increase the power consumption. In particularly, when a device equipped with the LCD device is a portable equipment driven by a battery, the increasing of the power consumption causes to decrease the driving time of the battery.

BRIEF SUMMARY OF THE INVENTION

Accordingly, an object of the present invention is, with due consideration to the drawbacks of the conventional technique, to provide an amplifier device and a liquid crystal display (LCD) device built-in the amplifier device capable of driving a capacitive load of a large capacitance with a high speed and with a low power consumption.

In accordance with a preferred embodiment of the present invention, an amplifier device driving a capacitive load, comprises a voltage-current conversion device, a current-voltage conversion device, a first output semiconductor element, and a second output semiconductor element. In particularly, the voltage-current conversion device comprises an amplifier stage amplifying an input signal voltage and a voltage-current conversion stage outputting a current corresponding to a first polarity output voltage of the amplifier stage. The current-voltage conversion device comprises a semiconductor element and a constant current source which are connected in series to each other. A current corresponding to the first polarity output voltage of the amplifier stage is supplied to a connection node between the semiconductor element and the constant current source. The current-voltage conversion device outputs a voltage corresponding to the current supplied to the connection node from the voltage-current conversion device. The first output semiconductor element controls a discharging operation to discharge electrical charges from the capacitive load based on the voltage output from the current-voltage conversion device according to the current corresponding to the first polarity output voltage of the amplifier stage. A second output semiconductor element controls a charging operation to supply electrical charges to the capacitive load based on a second polarity output voltage, which is different from the first polarity output voltage, of the amplifier stage.

Accordingly, the control of the discharging operation to discharge the electrical charges accumulated in the capacitive load is performed based on the first polarity output voltage of the amplifier stage, and the charging operation to charge the electrical charges to the capacitive load is performed based on the second polarity output voltage obtained from the amplifier stage. Because only the current corresponding to the input signal voltage is increased in order to increase the magnitude of the current flowing through the first output semiconductor element, it is possible to perform the charging and discharging operation of the electrical charges for the capacitive load rapidly without any increasing the power consumption of the amplifier device in order to set the voltage potential of the capacitive load to a desired level.

In accordance with another preferred embodiment of the present invention, an amplifier device driving a capacitive load comprises a voltage-current conversion device, a current-voltage conversion device, a first and second output semiconductor elements, and a control circuit. In particularly, the voltage-current conversion device comprises an amplifier stage amplifying an input signal voltage and a voltage-current conversion stage outputting a current corresponding to a first polarity output voltage of the amplifier stage. The current-voltage conversion device comprises a semiconductor element and a first constant current source which is connected in series to each other. The current corresponding to the first polarity output voltage of the amplifier stage is supplied to a connection node between the semiconductor element and the first constant current source through a switching transistor. The current-voltage conversion device outputs a voltage corresponding to the current supplied to the connection node from the voltage-current conversion device according to an operation of the switching transistor. The first output semiconductor element controls a discharging operation to discharge electrical charges from the capacitive load based on the voltage output from the current-voltage conversion device according to the current corresponding to the first polarity output voltage of the amplifier stage. The second output semiconductor element controls a charging operation to charge electrical charges to the capacitive load based on an output voltage of the amplifier stage. The control circuit controls an operation of the switching transistor based on the output voltage of the amplifier stage.

Thus, because the ON/OFF operation of the switching transistor is controlled based on the current that is converted from the output voltage by the control circuit, it is possible to supply and halt to supply the voltage corresponding to the current converted from the first polarity output voltage to the first output semiconductor element. Further, because the charging and discharging operation for the capacitive load can be performed quickly through the first and second output semiconductor elements without any increasing of the power consumption, it is possible to set the voltage potential of the capacitive load to a desired level quickly and with low power consumption.

In accordance with another preferred embodiment of the present invention, a liquid crystal display (LCD) device comprises a source driver comprising the amplifier device of the present invention, a gate driver, a control section transferring control signals to both the source driver and the gate driver in order to control the operation thereof, and a LCD section displaying images based on output signals from both the source driver and the gate driver.

DETAILED DESCRIPTION OF THE PREFERRED EMBODIMENTS

Other features of this invention will become apparent through the following description of preferred embodiments that are given for illustration of the invention and are not intended to be limiting thereof.

First embodiment

Figure 1:
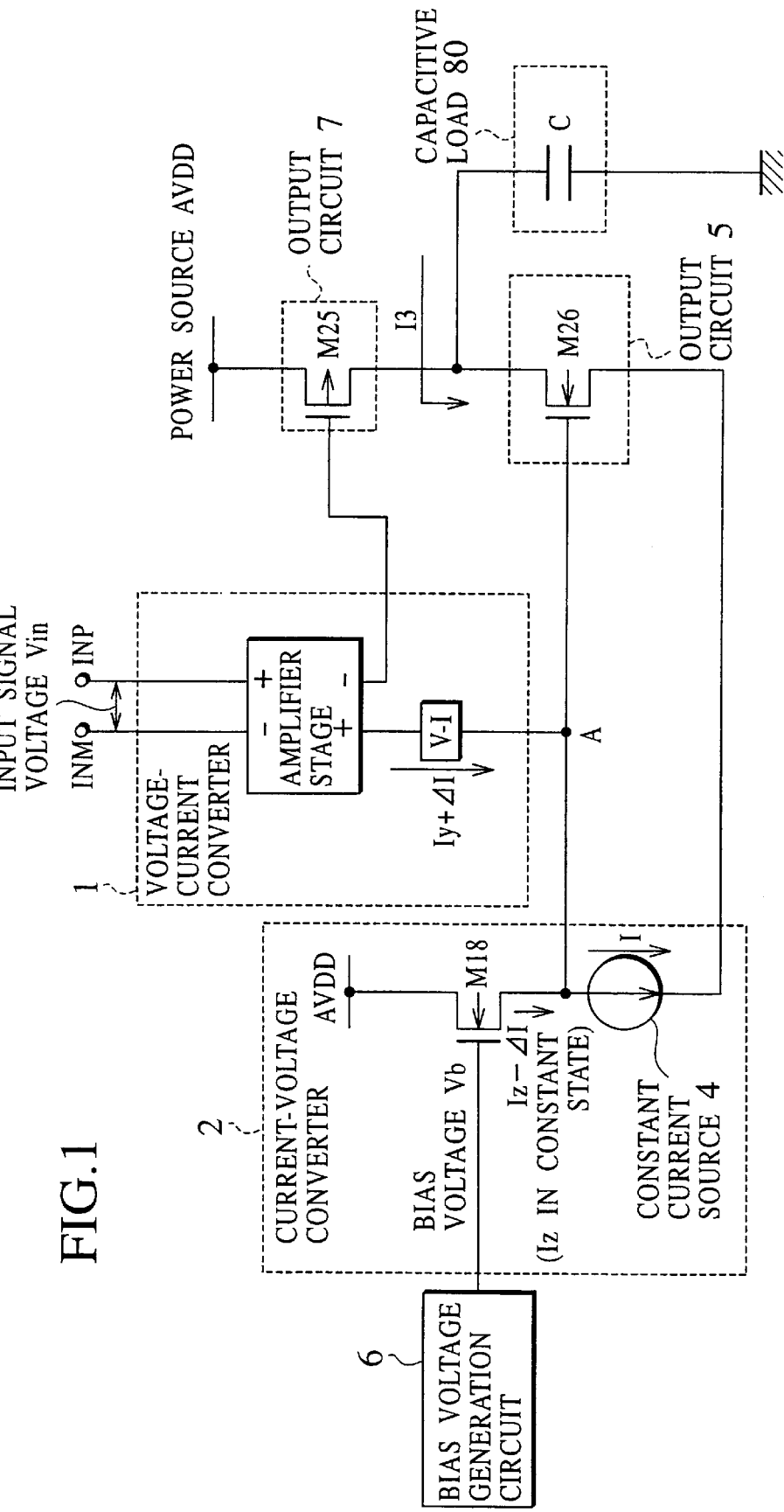
FIG. 1 is a block diagram showing a configuration of an amplifier device according to the first embodiment of the present invention.

FIG. 1 is a block diagram showing a configuration of the amplifier device according to the first embodiment of the present invention.

The amplifier device having the configuration shown in FIG. 1 comprises a voltage-current converter 1 for converting an input signal voltage Vin to a current, a constant current source 4 capable of always providing a constant current I, a MOS transistor M18 connected in series to the constant current source 4 for setting a gate voltage of a MOS transistor M26 during the steady state, an output circuit 5 made up of an output MOS transistor M26 whose gate is connected to the input side of the constant current source 4 and whose drain is connected to a capacitive load 80 (as a capacitance C), and an output circuit 7 made up of a MOS transistor M25.

In this configuration, the output circuit 5 controls the discharging of electrical charges accumulated in the capacitive load 80, and the output circuit 7 controls the charging electrical charges to the capacitive load 80. The operation of the MOS transistor M26 forming the output circuit 5 is controlled by the positive output voltage (+) from the amplifier stage in the voltage-current converter 1. On the other hand, the operation of the MOS transistor M25 forming the output circuit 7 is controlled by the negative output voltage (−) from the amplifier stage in the voltage-current converter 1.

The MOS transistor M18 and the constant current source 4 form a current-voltage converter 2, the capacitance C is an equivalent circuit of the capacitive load 80, and a bias voltage generation circuit 6 delivers a bias voltage Vb of a constant to the gate of the MOS transistor M18.

Figure 2:
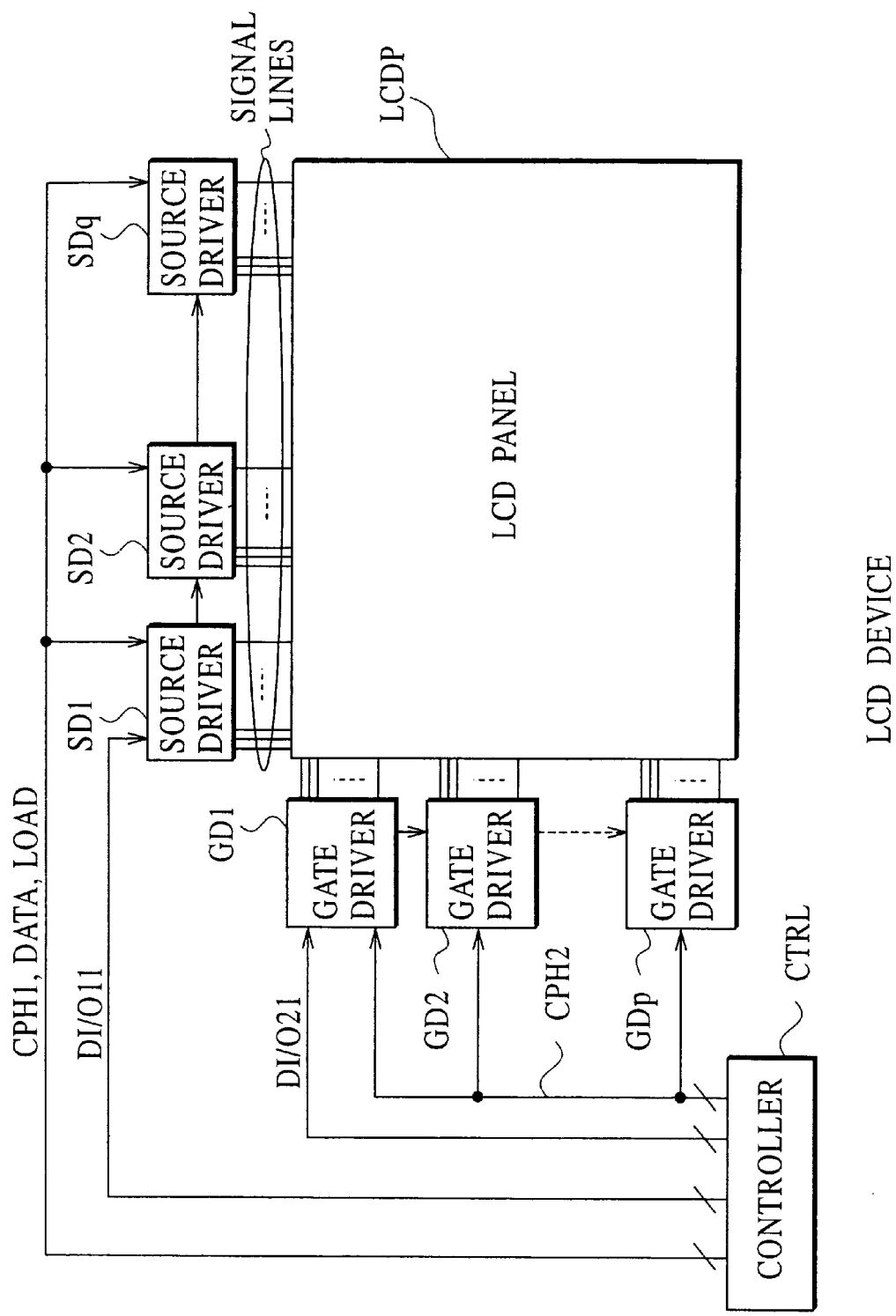
FIG. 2 is a block diagram showing an entire configuration of a LCD device built-in the amplifier device of the present invention.

FIG. 2 is a block diagram showing the entire configuration of a LCD (Liquid Crystal Display) device of the present invention. Each source driver includes the amplifier device of the present invention.

The LCD device shown in FIG. 2 comprises a LCD panel in which a plurality of LC cells, signal lines, and scan lines are arranged, source drivers SD1, SD2, . . . , and SDq (q is an integer of not less than 1), each driving a plurality of the signal lines, gate drivers GD1, GD2, . . . , and GDp (p is an integer of not less than 1), each driving a plurality of the scan lines, and a controller CTRL for controlling the operation of the source drivers SD1, SD2, . . . , and SDq and the gate drivers GD1, GD2, . . . , and GDp. In this configuration, each source driver is formed in one semiconductor chip.

In the LCD device shown in FIG. 2, all the signal lines of the LCD panel are driven by the source drivers SD1, SD2, . . . , and SDq, so that the information is displayed on the LCD panel.

The controller CTRL supplies clock CPH1, input signal (shift pulse) DI/0I1, digital gray-scale data DATA, and load signal LOAD to the source drivers SD1, SD2, . . . , and SDq. Thereby, each source driver outputs a voltage signal, to the LCD panel, that is necessary to drive the signal lines of the LCD panel. Thus, each of the source driver SD1, SD2, . . . , and SDq drives the signal lines of a block sequentially in lateral direction as a part of the LCD panel.

On the other hand, the controller CTRL also supplies the clock CPH2 and input signal DI/021 to the gate drivers GD1, GD2, . . . , and GDp. Thereby, based on the signal each gate driver outputs a voltage signal, to the LCD panel, that is necessary to drive the gate lines of the LCD panel.

Each of the source drivers SD1, SD2, . . . , and SDq described above includes the amplifier device as a buffer amplifier corresponding to the amplifier device of each embodiment.

Figure 3:
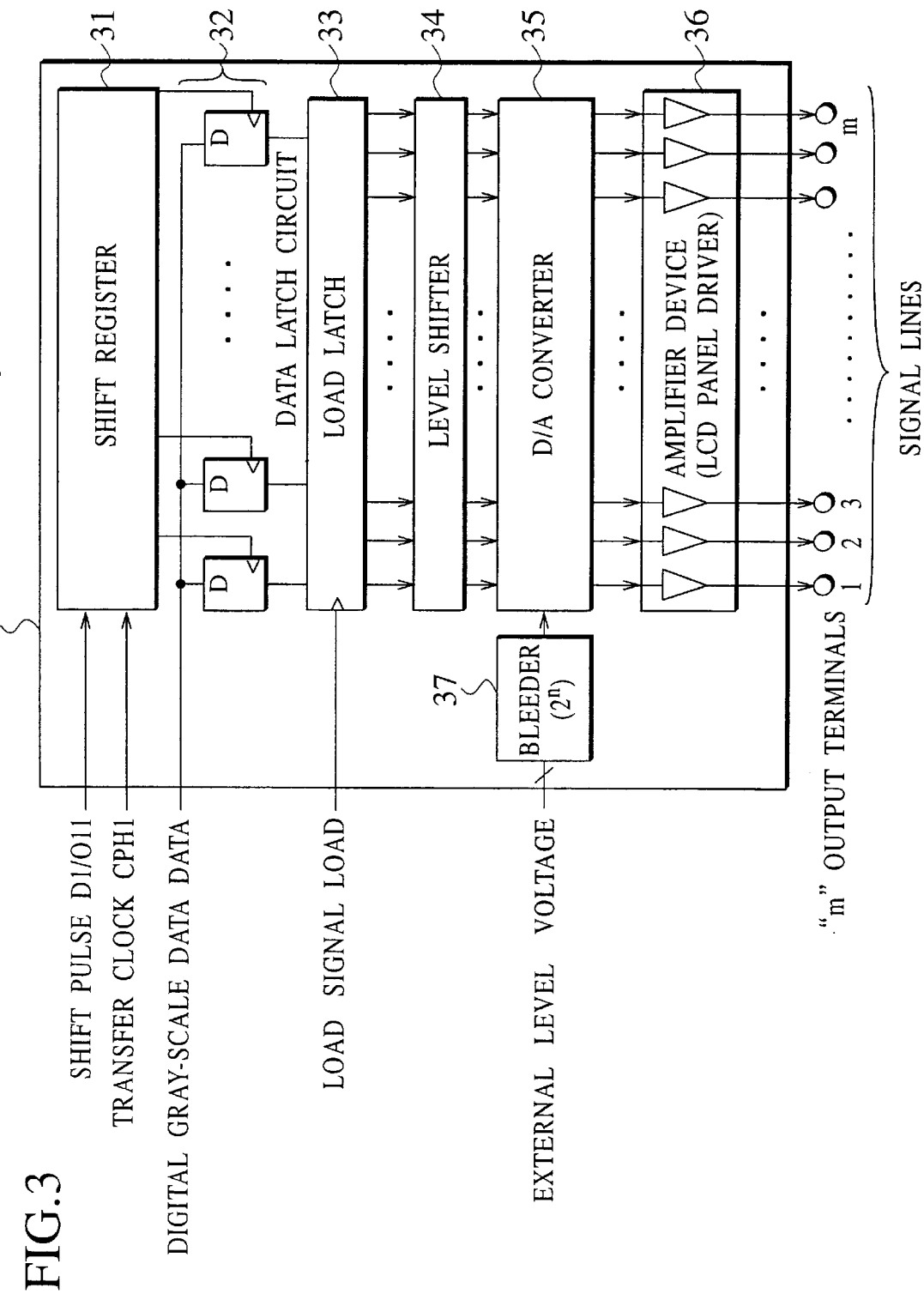
FIG. 3 is a block diagram showing a configuration of a source driver equipped with the amplifier device corresponding to each preferred embodiment in the LCD device shown in FIG. 2 according to the present invention.

FIG. 3 is a block diagram showing a detailed configuration of each source driver SD1, SD2, . . . , and SDq equipped with the amplifier device corresponding to each embodiment.

In FIG. 3, reference number 31 designates a shift register for shifting a shift pulse sequentially, in synchronization with a transfer clock, transferred from the controller CTRL as an external device to the source driver. Reference number 32 denotes a plurality of data latch circuits for latching digital gray-scale data in synchronization with a shift pulse output from each output terminal of the shift register 31. Reference number 33 indicates a load latch circuit for latching outputs from a plurality of the data latch circuits 32 in synchronization with the load signal. Reference number 34 designates a level shifter for converting the level of the output from the load latch circuit 33. Reference number 35 denotes a D/A converter for outputting analogue voltage corresponding to the output voltage form the level shifter 34. Reference number 36 indicates a buffer amplifier that corresponds to each amplifier device of the embodiment. Reference number 37 designates a bleeder for generating an analogue standard voltage corresponding to the digital gray-scale data.

Each of the amplifier devices described below can be incorporated in the source driver shown in FIG. 3, and each source driver is also incorporated in the LCD device shown in FIG. 2.

Next, a description will be given of the operation of the amplifier device shown in FIG. 1 according to the first embodiment.

Because the constant current source 4 supplies a constant current I continuously, the gate voltage of the MOS transistor M26 is determined based on the magnitude of the current flowing through the MOS transistor M18 during the steady state. Accordingly, the gate bias voltage of the MOS transistor M26 in the steady state can be determined by adjusting the magnitude of the current flowing through the MOS transistor M18 by using the bias voltage Vb applied to the gate of the MOS transistor M18.

In the steady state, when the current from the voltage-current converter 1 is Iy and the current flowing through the MOS transistor M18 is Iz, and the constant current from the constant current source 4 is I, the flowing relationship can be obtained in the steady state: I=Iy+Iz.

When the input signal voltage Vin is changed, the magnitude of the current corresponding to the positive voltage (+) from the amplifier stage in the voltage-current converter 1 is also changed. When this change of the current is a ΔI and the relationship I<Iz+Iy+ΔI is satisfied, the gate voltage of the MOS transistor M26 can be changed according to the change of the current ΔI.

Accordingly, when the input signal voltage Vin is changed, and so that the magnitude of the current (Iy+ΔI) from the voltage-current converter 1 is increased, the gate voltage of the MOS transistor M26 is increased, and the magnitude of a current I3 discharged from the capacitance C through the MOS transistor M26 is thereby increased. In particularly, when the sum of the maximum current ΔI and the current Iy is greater than the magnitude of the current I supplied from the constant current source 4, no current flows through the transistor M18 when the magnitude of the change of the input signal voltage Vin is large. That is, the transistor M18 is turned OFF and the gate voltage of the transistor M26 is extremely increased, so that it is possible to discharge the electrical charges from the capacitance C rapidly.

In addition, when the capacity of the capacitance C becomes large, or when the discharging speed of the electrical charges accumulated in the capacitance C is increased, it is sufficient to increase the current output from the voltage-current converter 1 or to decrease the current I supplied from the constant current source 4.

As described above, according to the amplifier device of the first embodiment, the current I3 flows through the MOS transistor M26 by changing the gate voltage of the MOS transistor M26 forming the output circuit 5 based on the current which is supplied based on the positive output voltage (+) of the voltage-current converter 1 according to the level of the input signal voltage Vin, and the discharging operation of the electrical charges from the capacitive load 80 is thereby controlled.

Figure 17:
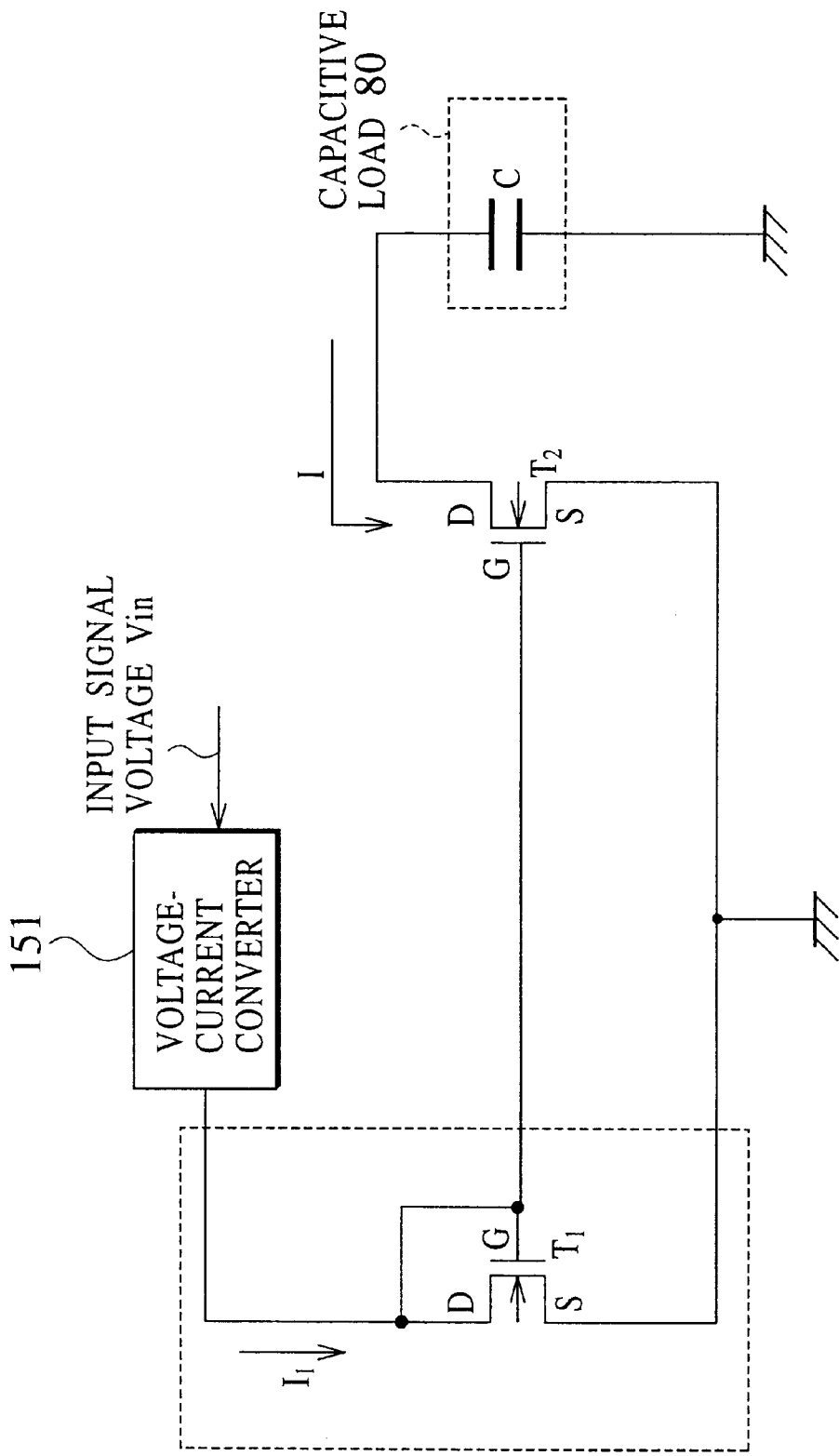
FIG. 17 is a block diagram showing a configuration of a conventional amplifier device.
Figure 18:
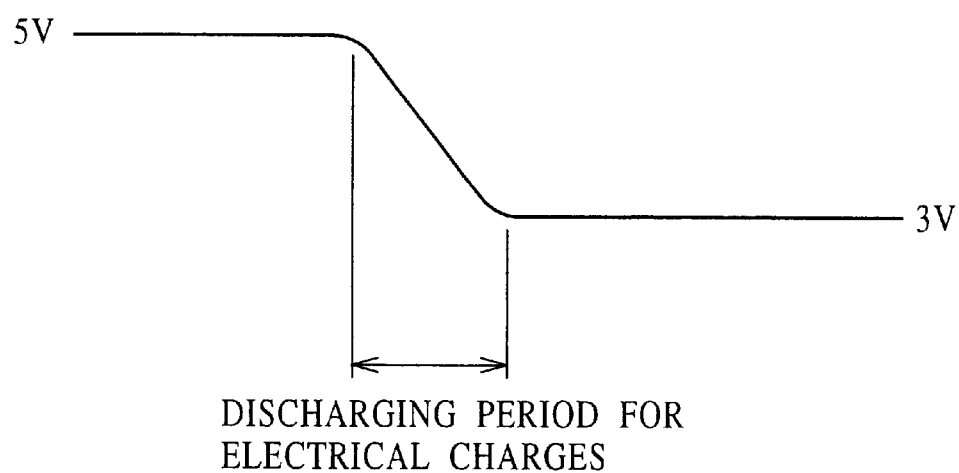
FIG. 18 is a characteristic diagram showing a change of a voltage of a capacitive load in the conventional amplifier device shown in FIG. 17.

Accordingly, it is possible to drive the capacitive load 80 by using a half of the power consumption when compared with that of the configuration of the conventional amplifier device shown in FIG. 17. That is, the configuration of the amplifier device of the present invention can drive a large capacitive load at a high speed with low power consumption.

In addition, according to the negative output voltage (−) obtained by the level of the input signal voltage Vin, the operation of the transistor M25 forming the output circuit 7, namely, the charging operation to charge the electrical charges to the capacitive load 80 is controlled.

Furthermore, because a power consumption is not almost increased when the amplifier device of the first embodiment drives LC cells in a LCD device as the capacitive loads by discharging electrical charges rapidly from the capacitive load in order to display image at a high speed, it is possible to achieve the above features without any decreasing of the driving performance of a battery for a portable information processing device built-in the LCD device.

Second embodiment

Figure 4:
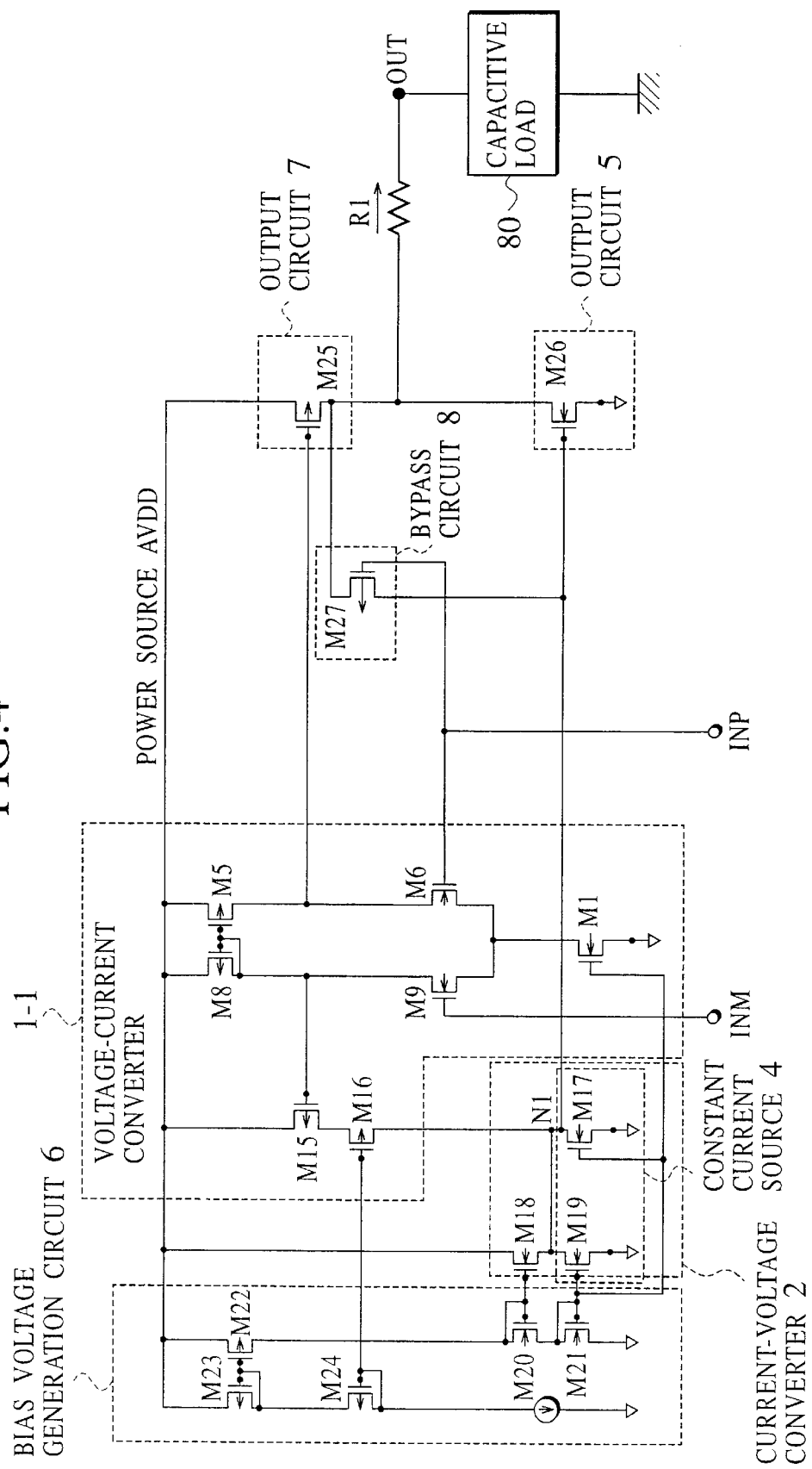
FIG. 4 is a circuit diagram showing a configuration of an amplifier device according to the second embodiment of the present invention.

FIG. 4 is a circuit diagram showing a configuration of the amplifier device according to the second embodiment of the present invention. In FIG. 4, the same components of the first embodiment shown in FIG. 1 will be referred to as the same reference numbers and characters, and the explanation for them is omitted here.

The amplifier device of the second embodiment shown in FIG. 4 comprises a voltage-current converter 1-1 for converting a voltage to a current, the constant current source 4 for supplying a constant current, the output circuit 5 for discharging electrical charges from the capacitive load 80 through a resistance R1, the MOS transistor M18 for setting a gate bias voltage of the MOS transistor M26 forming the output circuit 5 during the steady state, the bias voltage generator 6 for generating the bias voltage to be supplied to the gate of the MOS transistor M18, the output circuit 7 for supplying electrical charges to the capacitive load 80 through the resistance R1, and a bypass circuit 8 for discharging electrical charges from the capacitive load 80 through a path including the resistance R1. This path is different in configuration from the path through the output circuit 5, where the resistance R1 is incorporated into the configuration of the amplifier device in order to perform the amplifier device with stability and without any occurrence of oscillation.

The voltage-current converter 1-1 comprises MOS transistors M6 and M9 forming a differential pair, a MOS transistor M1 as a current source through which the differential pair (made up of both the MOS transistors M6 and M9) is connected to the ground voltage level, and MOS transistors M15 and M16 for converting a voltage difference detected by the differential amplifier stage.

The positive output voltage (+) supplied through the drain of the MOS transistor M9 in the differential amplifier stage controls the operation of the MOS transistor M26 forming the output circuit 5, and the negative output voltage (−) supplied through the drain of the MOS transistor M6 in the differential pair controls the operation of the MOS transistor M25 forming the output circuit 7.

The constant current source 4 comprises MOS transistors M17 and M19. The bias voltage generator 6 comprises transistors M20, M21, M22, M23, and M24. The output circuit 5 comprises the MOS transistor M26 through which the electrical charges accumulated in the capacitive load 80 are discharged. The output circuit 7 comprises the MOS transistor M25 through which the electrical charges are charged to the capacitive load 80. The bypass circuit 8 comprises a MOS transistor M27.

Next, a description will be given of the operation of the amplifier device according to the second embodiment.

The amplifier device of the second embodiment shown in FIG. 4 includes the output circuit 7 for supplying electrical charges to the capacitive load 80 in order to raise the voltage thereof and the operation of the output circuit 7 is controlled by the voltage-current converter 1-1 based on the signal voltage of each of input terminals INP and INM.

The output circuit 7 supplies electrical charges from the power source AVDD to the capacitive load 80 through the resistance R1 in order to set the voltage of the capacitive load 80 to a desired level. Similar to the amplifier device of the first embodiment shown in FIG. 1, the amplifier device of the second embodiment shown in FIG. 4 can also discharge the voltage of the capacitive load 80 in order to set the voltage of the capacitive load 80 to a desired level. Accordingly, the amplifier device of the second embodiment can raise and down the voltage potential of the capacitive load 80 to a desired level corresponding to the input signal voltage between the input terminals INP and INM.

By the way, the MOS transistor M15 in the voltage-current converter 1-1 converts the voltage difference detected by the differential amplifier stage to a current. This current from the MOS transistor M15 has a fluctuation because the drain voltage of the MOS transistor M15 is greatly different in level from that of the MOS transistor M8. The additional MOS transistor M16 is connected to the MOS transistor M15 in series in order to suppress the fluctuation of the current output from the MOS transistor M15. The stable current can thereby be supplied to a connection node N1 between the constant current source 4 and the gate of the MOS transistor M26.

The MOS transistor M16 forms a compensation circuit. The bias voltage generator 6 supplies a desired bias voltage to the gate of the MOS transistor M26 in order to suppress the fluctuation of the current output from the MOS transistor M15.

The suppression to the fluctuation of the current output from the voltage-current converter 1-1 can lead to eliminate the fluctuation of the gate voltage of the MOS transistor M26. Thereby, the voltage of the capacitive load 80 can be set to a desired level stably, so that it is possible to display the image on the LCD stably and to increase the quality of the image.

The MOS transistor M27 forms the bypass circuit 8. The gate of the MOS transistor M27 is connected to one input terminal INP of the amplifier device. Accordingly, the electrical charges accumulated in the capacitive load 80 can also be discharged through the MOS transistor M27 forming the bypass circuit 8 that is different in configuration from the bypass including the output circuit 5.

The MOS transistor M27 enters ON under the mode to down the voltage of the capacitive load 80, and the electric charges from the capacitive load 80 are thereby discharged through the resistance R1, and the current is thereby supplied to the gate of the MOS transistor M26 forming the output circuit 5. Because the electrical charges accumulated in the capacitive load 80 are also discharged through the bypass that is different from the bypass including the output circuit 5, it is possible to down the level of the voltage of the capacitive load 80 at a high speed.

Furthermore, because the current through the MOS transistor M27 is supplied to the gate of the MOS transistor M26, it is possible to accelerate the increasing of the voltage of the gate of the MOS transistor M26 and also increase the amount of the current flow from the capacitive load 80 through the MOS transistor M26 rapidly, and it is thereby possible to perform the operation of the arithmetic amplifier device at a high speed.

Figure 5:
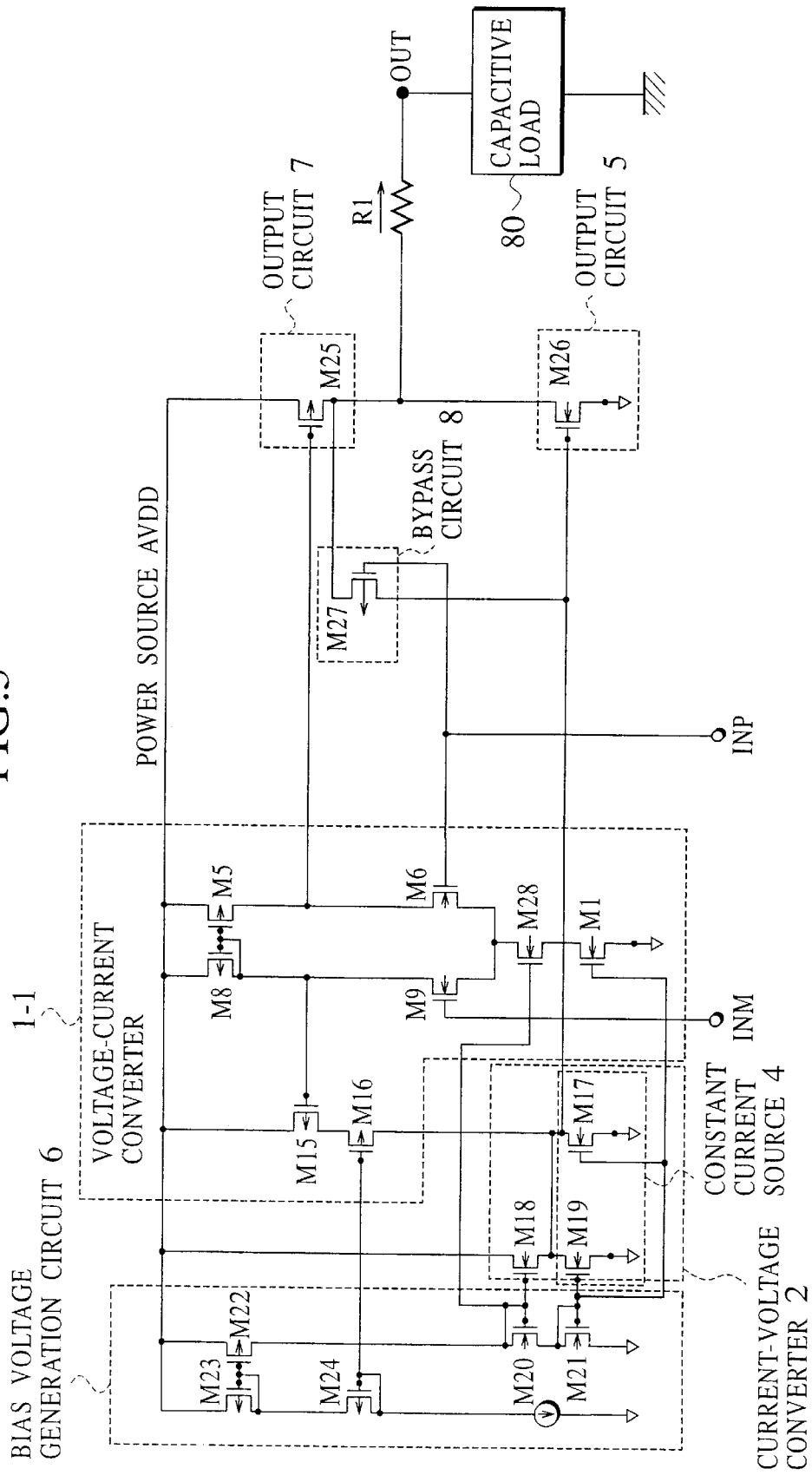
FIG. 5 is a circuit diagram showing another configuration of the amplifier device according to the second embodiment of the present invention.

FIG. 5 is a circuit diagram showing another configuration of the amplifier device of the present invention. The configuration shown in FIG. 5 further includes the following configuration in addition to the configuration shown in FIG. 4. The MOS transistor M28 is connected in cascade to the node between the differential pair (MOS transistors M6 and M9) and the MOS transistor M1, and the gate of the MOS transistor M28 is directly connected to the gate of the MOS transistor M18 forming the current-voltage converter 2. In this configuration, the gate of the MOS transistor M1 is connected to that of the MOS transistor M19, and the gate of the MOS transistor M28 is connected to that of the MOS transistor M18. This two-stage configuration can keep the sum of the output current from the differential pair made up of the MOS transistors M6 and M9 in the differential amplifier stage to an approximate constant value, and further increase the conversion accuracy of the voltage to current conversion.

Figure 6:
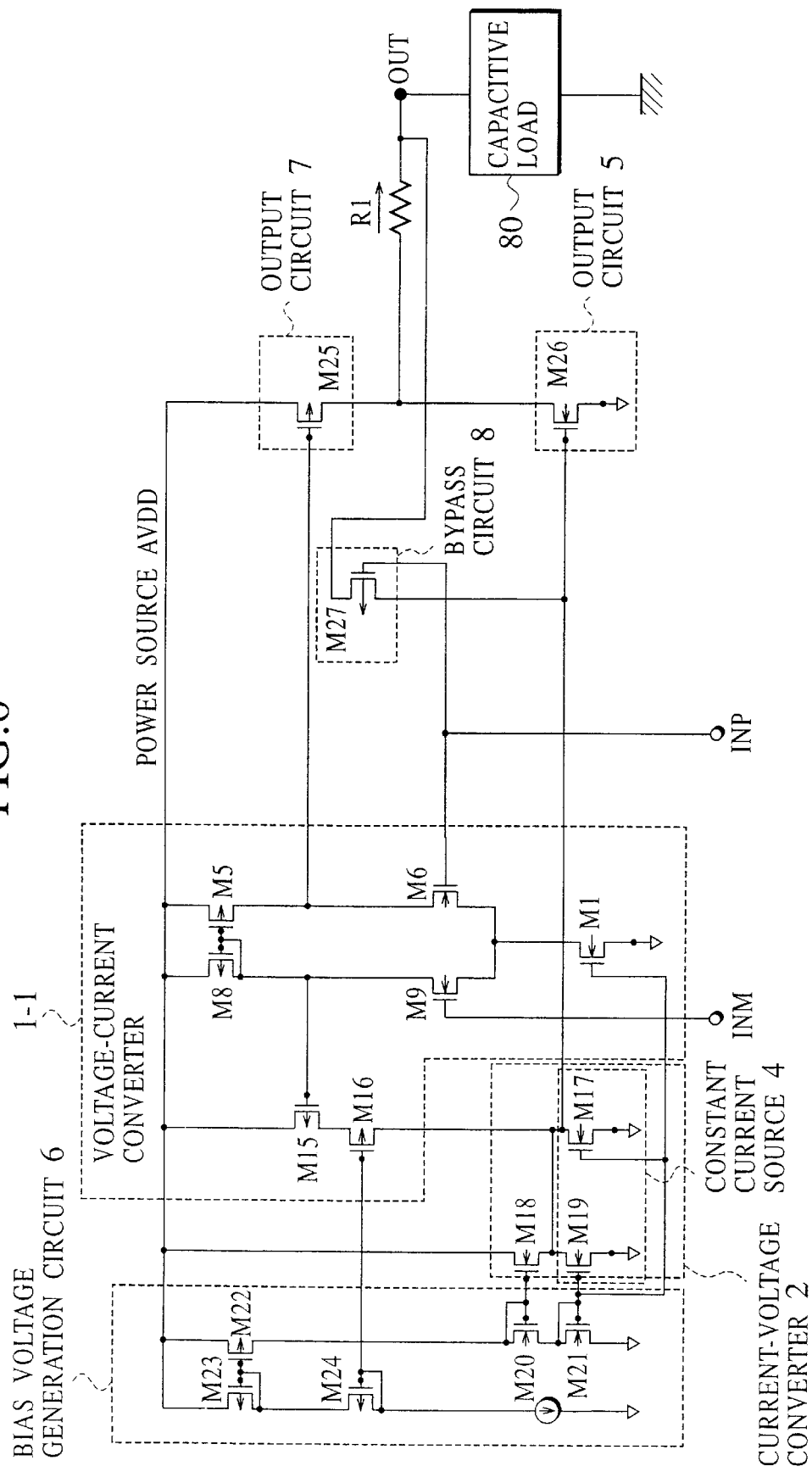
FIG. 6 is a circuit diagram showing another configuration of the amplifier device according to the second embodiment of the present invention.

FIG. 6 is a circuit diagram showing another configuration of the amplifier device of the present invention. In the configuration shown in FIG. 6, the output node OUT of the capacitive load 80 is directly connected to the MOS transistor M27 forming the bypass circuit 8 without through the resistance R1. The configuration, in which the bypass circuit 8 is directly connected to the capacitive load through a pass as a sensitivity raising section and not through the resistance R1, can rise a sensitivity of the bypass circuit 8 because this configuration can decrease a threshold voltage of the MOS transistor M27 cosmetically.

Figure 7:
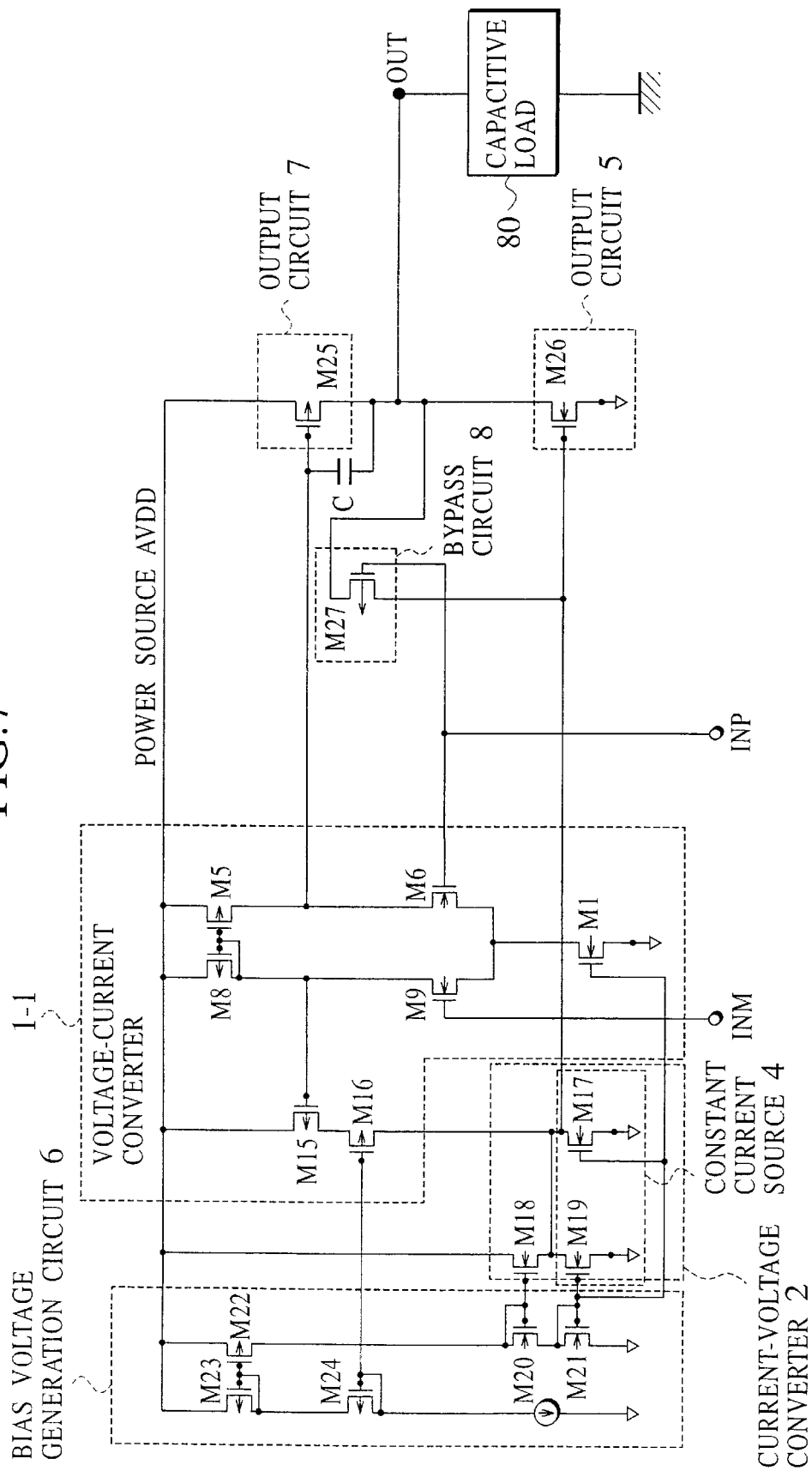
FIG. 7 is a circuit diagram showing another configuration of the amplifier device according to the second embodiment of the present invention.

FIG. 7 is a circuit diagram showing another configuration of the amplifier device of the present invention. In the configuration shown in FIG. 7, a capacitance C is incorporated between the output node OUT of the capacitive load 80 and the gate of the MOS transistor M25 forming the output circuit 7, instead of the resistance R1 in the configuration shown in FIG. 4. Other circuit components are the same of those in the amplifier device shown in FIG. 4.

Thus, it is possible to perform the amplifier device without any occurrence of oscillation of the amplifier device even if the capacitance C is used instead of the resistance R1.

The amplifier device of the present invention can include the configuration in which both the resistance R1 shown in FIG. 4 and the capacitance C shown in FIG. 7 are incorporated. This configuration can perform the amplifier device stability without any occurrence of oscillation.

Figure 8:
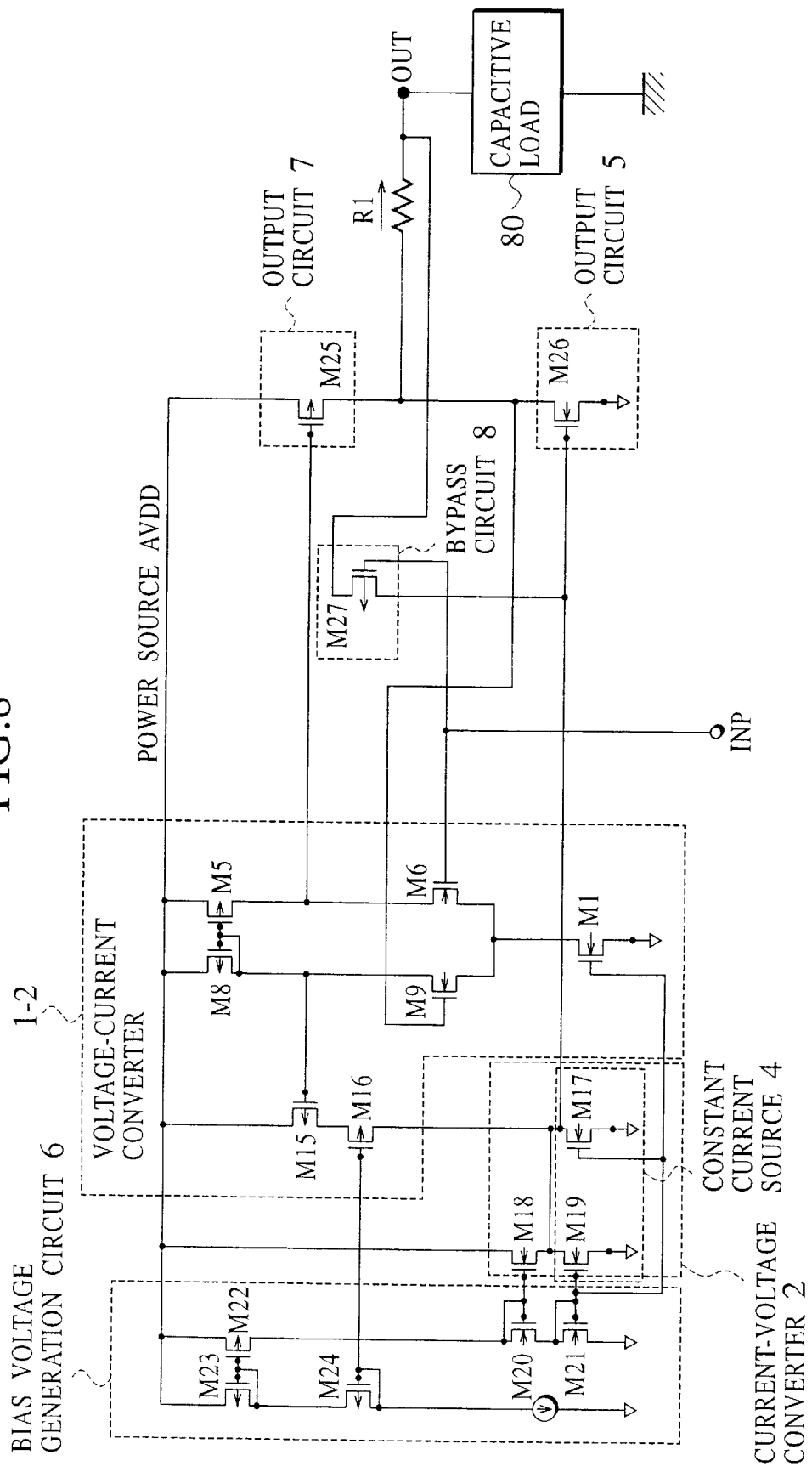
FIG. 8 is a circuit diagram showing a configuration of a voltage-current converter in an amplifier device shown in FIG. 4.

FIG. 8 is a circuit diagram showing another configuration of the amplifier device of the present invention. In the configuration shown in FIG. 8, the gate of the MOS transistor M9 forming the differential amplifier stage in the voltage-current converter 1-2 is connected to the output node OUT of the capacitive load 80 through the resistance R1, not connected to the input terminal INM. This configuration of the differential amplifier stage of the voltage-current converter 1-2 is a voltage-follower type. Thus, it is possible to obtain the same effect of the amplifier device shown in FIG. 4.

Figure 9:
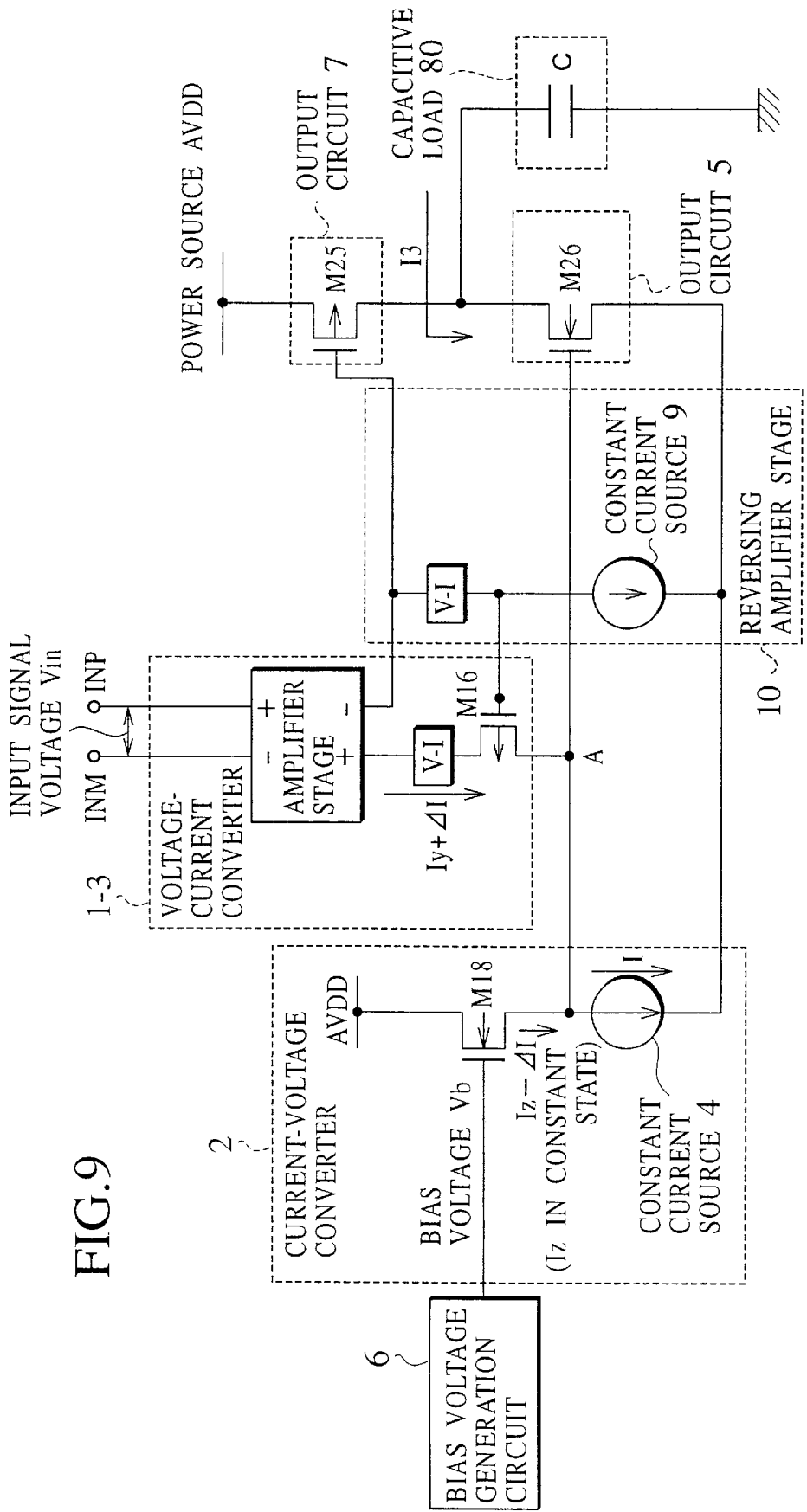
FIG. 9 is a circuit diagram showing another configuration of the amplifier device according to the second embodiment of the present invention.

FIG. 9 is a circuit diagram showing another configuration of the amplifier device of the present invention. In particularly, FIG. 9 shows the configuration in which a reversing amplifier stage is provided at the side of the negative output voltage (−) of the differential amplifier stage in the voltage-current converter 1-3, the operation of a switching MOS transistor M16 provided at the side of the positive output voltage (+) of the differential amplifier stage in the voltage-current converter 1-3 is controlled by using the output of the voltage-current converter (V-I) in the reversing amplifier stage. Reference number 9 indicates a constant current source provided in the reversing amplifier sage.

Figure 10:
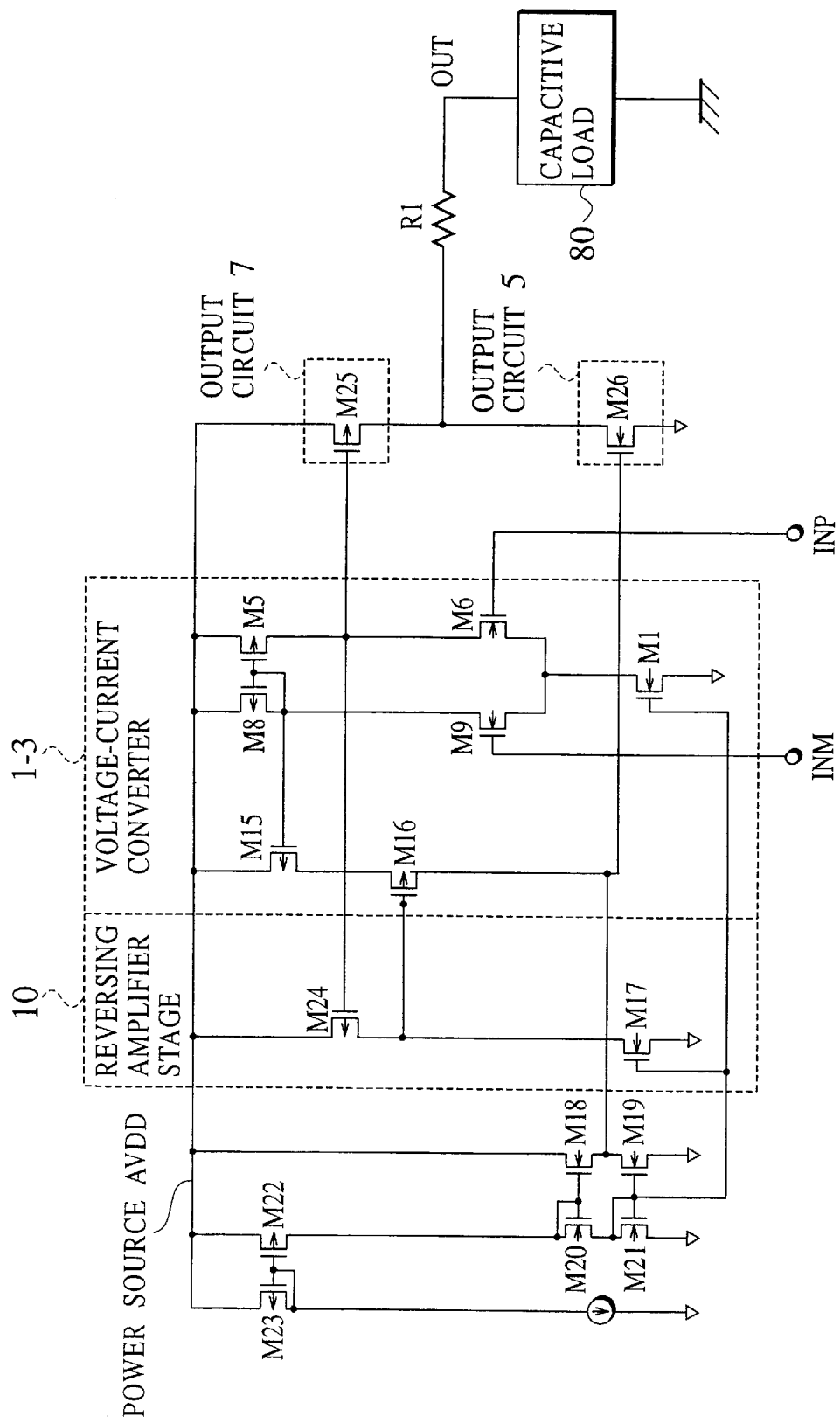
FIG. 10 is a circuit diagram showing another configuration of the amplifier device according to the second embodiment of the present invention.

FIG. 10 is a circuit diagram showing a detailed configuration of the amplifier device shown in FIG. 9. In FIG. 9, the voltage-current converter 1-3 comprises the MOS transistors M6 and M9 forming the differential pair, the MOS transistors M5 and M8 through which the differential pair is connected to the power source AVDD, the MOS transistor M15 for outputting the current Iy+ΔI from the positive output voltage (+) of the differential amplifier stage in the voltage-current converter 1-3, and the switching MOS transistor M16. The reversing amplifies stage 10 comprises a MOS transistor M24 as a voltage-current converter stage (V-I) and a MOS transistor M17 as the constant current source 9.

Thus, the MOS transistors M17 and M24 form the reversing amplifier stage 10 and this reversing amplifier stage 10 is provided at the side of the negative output voltage (−) of the differential amplifier stage in the voltage-current converter 1-3. In this configuration, the operation of the switching MOS transistor M16 placed at the side of the positive output voltage (+) of the differential amplifier stage in the voltage-current converter 1-3 is controlled by using the output from the voltage-current converter (V-I) in the reversing amplifier stage 10.

In other words, the voltage of the connection node between the MOS transistors M24 and M17 becomes the gate voltage of the switching MOS transistor M16, and the MOS transistors M24 and M7 forming the reversing amplifier stage 10 as a control circuit controls the operation of this switching MOS transistor M16.

The MOS transistor M1 is a current source through which the differential pair is connected to the ground voltage level.

In the amplifier device having the configuration shown in FIG. 9 and FIG. 10, the nagative output voltage (−) is converted to the current by the MOS transistor M24, and the ON/OFF operation of the switching MOS transistor M16 in the voltage-current converter 1-3 is controlled based on this current. Accordingly, it is possible to control the supply of the voltage to the MOS transistor M26 in the output circuit 5 based on the current converted from the positive output voltage (+) that also corresponds to the level of the input signal voltage Vin.

The amplifier device shown in FIG. 9 and FIG. 10 can perform the charging operation to and the discharging operation from the capacitive load 80 at high speed and without any increasing of the power consumption through the MOS transistor M25 in the output circuit 7 and the MOS transistor M26 in the output circuit 5. It is therefore possible to set the voltage potential of the capacitive load 80 to a desired level quickly with low power consumption.

In addition, it is possible to set the gate-bias of the MOS transistor M26 forming the output circuit 5 to a constant level regardless of the level of the input signal voltage Vin during the steady state. This can introduce to keep the current consumption at a constant value. Furthermore, even if the ability of the change of the input signal voltage Vin is increased, in other words, when the size of the MOS transistor M15 is large, there is the effect that it is possible to suppress any increasing of the power supply.

Figure 11:
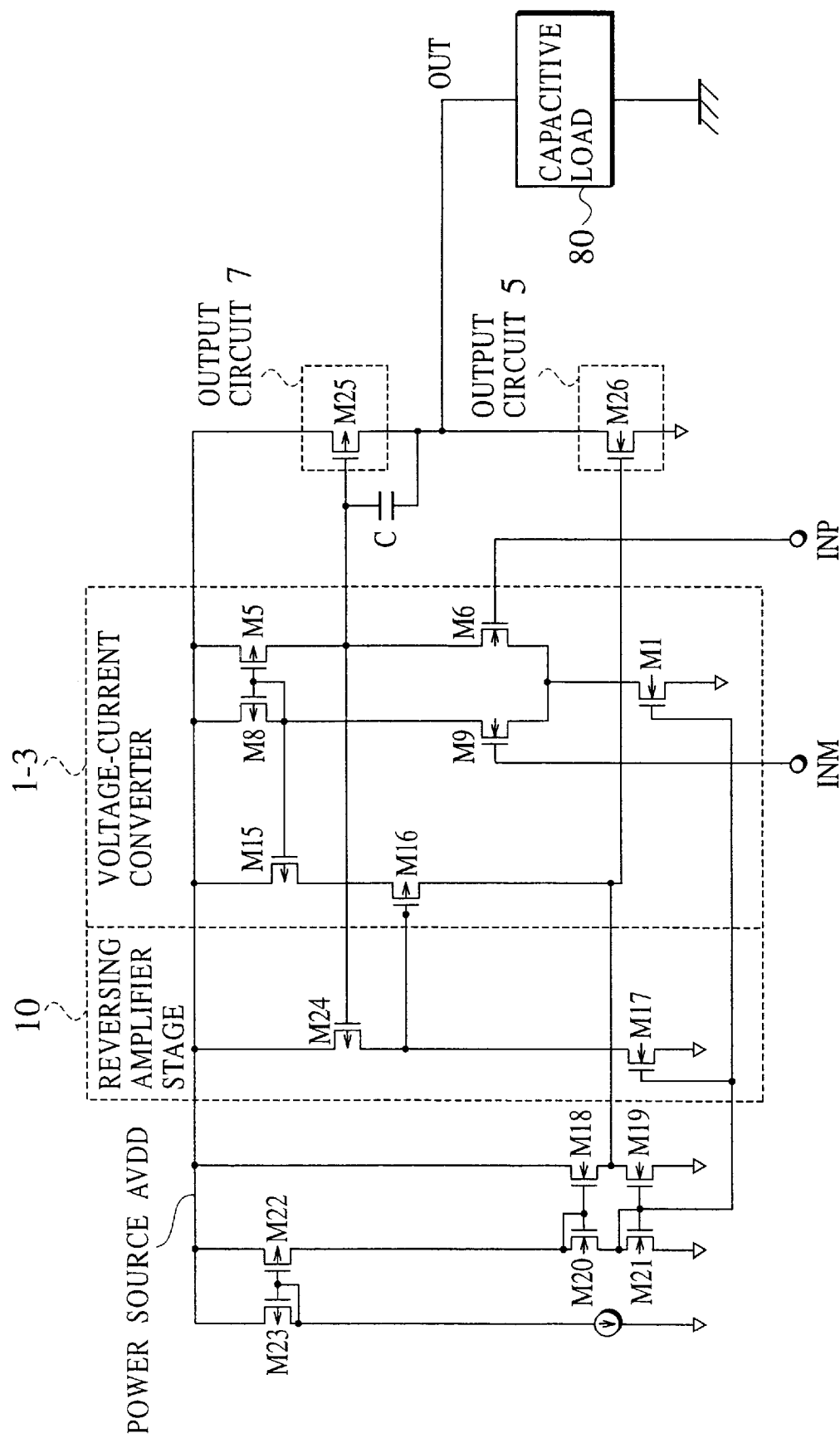
FIG. 11 is a circuit diagram showing another configuration of the amplifier device according to the second embodiment of the present invention.

FIG. 11 is a circuit diagram showing another detailed configuration of the amplifier device shown in FIG. 9. In the configuration shown in FIG. 11, a capacitance C is incorporated between the output node OUT of the capacitive load 80 and the gate of the MOS transistor M25 forming the output circuit 7, instead of the resistance R1 in the configuration shown in FIG. 8. Other circuit components of the configuration shown in FIG. 11 are the same of those in the amplifier device shown in FIG. 10.

Thus, it is possible to perform the amplifier device without any occurrence of oscillation of the amplifier device even if the capacitance C is used instead of the resistance R1.

The amplifier device of the present invention can include the configuration in which both the resistance R1 shown in FIG. 10 and the capacitance C shown in FIG. 11 are incorporated. This configuration can perform the amplifier device stability without any occurrence of oscillation.

Figure 12:
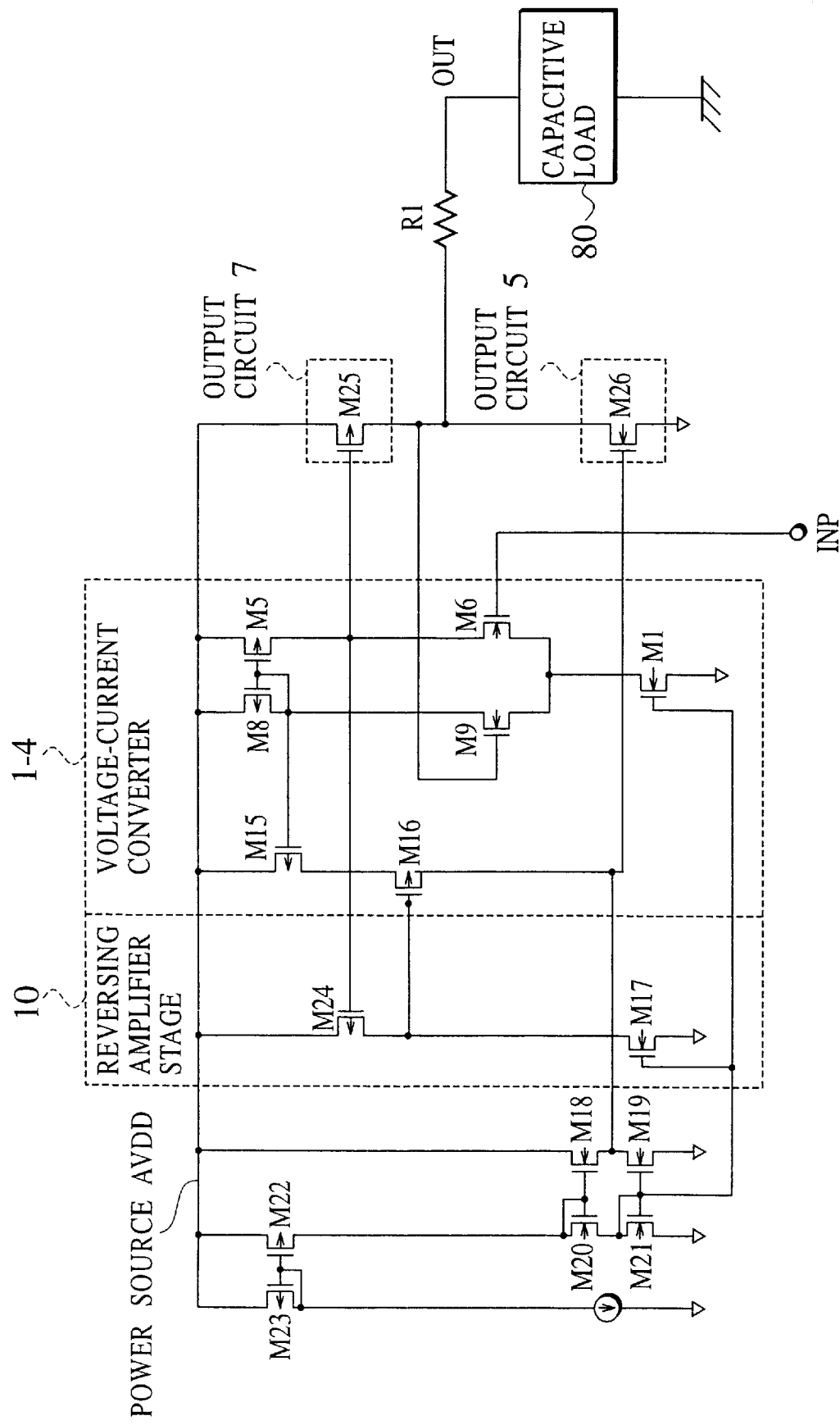
FIG. 12 is a circuit diagram showing another configuration of the amplifier device according to the second embodiment of the present invention.

FIG. 12 is a circuit diagram showing another detailed configuration of the amplifier device shown in FIG. 9. In the configuration shown in FIG. 12, the gate of the MOS transistor M9 forming the differential amplifier stage in the voltage-current converter 1-4 is connected to the output node OUT of the capacitive load 80 (namely, to the output side of the amplifier device) through the resistance R1, not connected to the input terminal INM. This configuration of the differential amplifier stage in the voltage-current converter 1-4 is a voltage-follower type. Thus, it is possible to obtain the same effect when the differential amplifier stage in the amplifier device has the voltage follower configuration.

When each of the voltage-current converters 1-3 and 1-4 shown in FIGS. 9 to 12 is incorporated into the amplifier device, it is possible to perform the same operation of and to obtain the same effect of the voltage-current converters 1 and 1-1 shown in FIG. 1 and FIG. 4. In particularly, the amplifier devices having the configurations shown in FIG. 1 and FIG. 4 to FIG. 8 can perform a quick response to the change of the input signal voltage Vin when compared with the amplifier devices shown in FIG. 9 to FIG. 12. Thus, the amplifier devices having the configurations shown in FIG. 1, FIG. 4 to FIG. 8, and FIG. 9 to FIG. 11 can be applied to LCD devices of higher response ability.

Third embodiment

Figure 13:
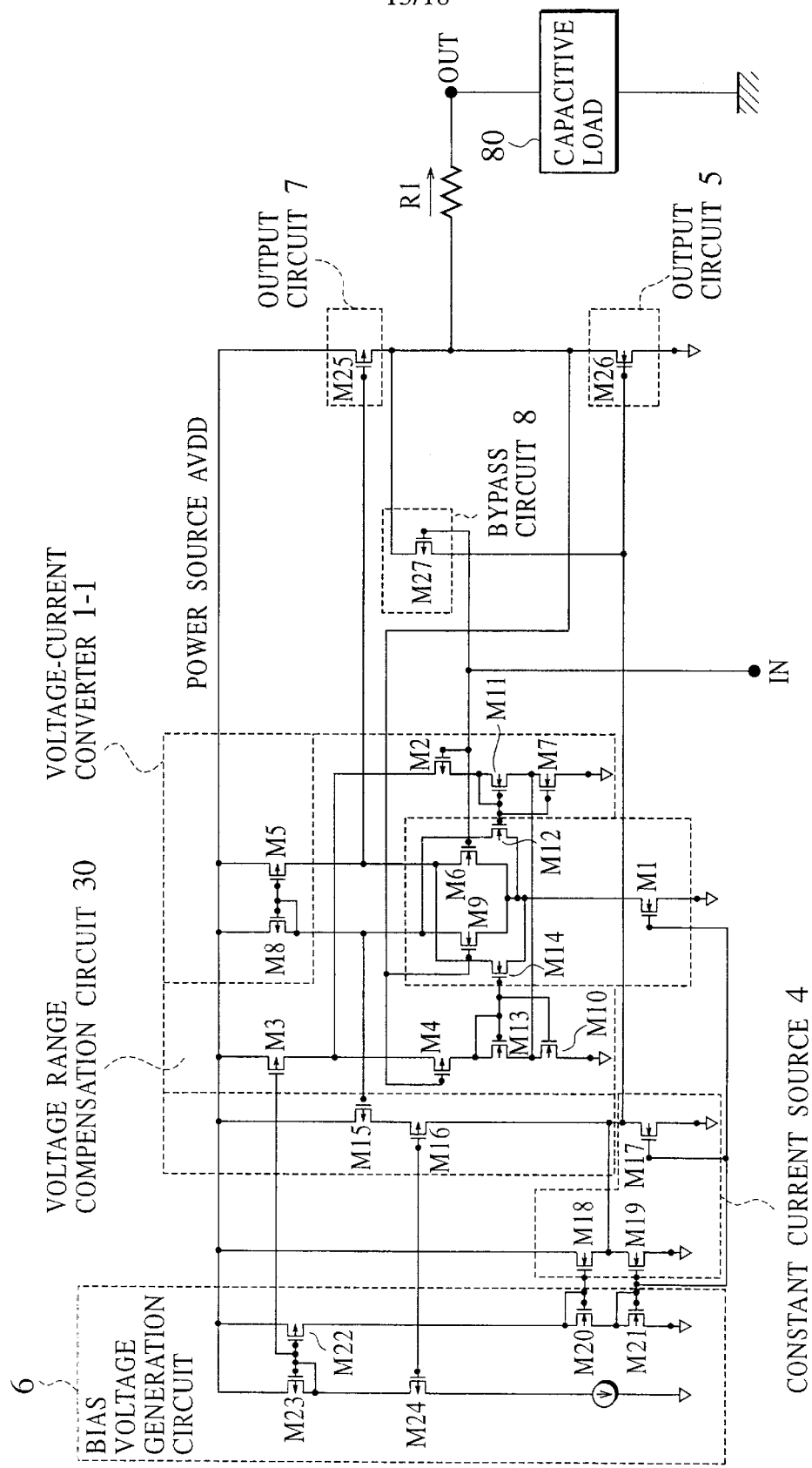
FIG. 13 is a block diagram showing a configuration of an amplifier device according to the third embodiment of the present invention.

FIG. 13 is a block diagram showing a configuration of the amplifier device according to the third embodiment of the present invention. In FIG. 13, the same components in the amplifier device of the second embodiment shown in FIG. 4 will be referred to as the same reference numbers and characters, and the explanation for them is omitted here.

The amplifier device according to the third embodiment shown in FIG. 13 includes a voltage-range compensation circuit 30 that is indicated by dotted lines.

The voltage-range compensation circuit 30 comprises MOS transistors M2, M3, M4, M7, M10, M11, and M13. In particularly, because the MOS transistors M4 is a P-type MOS transistor that is the opposite polarity to the MOS transistors M6, M9, M12, and M14 forming the differential amplifier stage, those MOS transistors M7, M10, M11, and M13 are capable of enlarging the range of the input voltage in same phase supplied from the voltage-current converter 1-1.

Figure 14A:
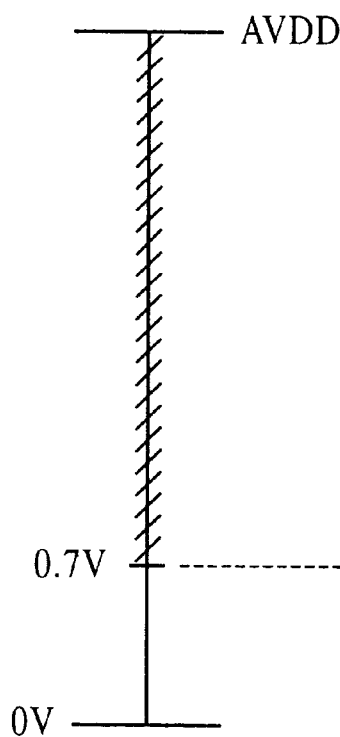
FIGS. 14A and 14B are diagrams, each showing a range of an input voltage of a voltage-current converter in the amplifier device of the third embodiment shown in FIG. 13.
Figure 14B:
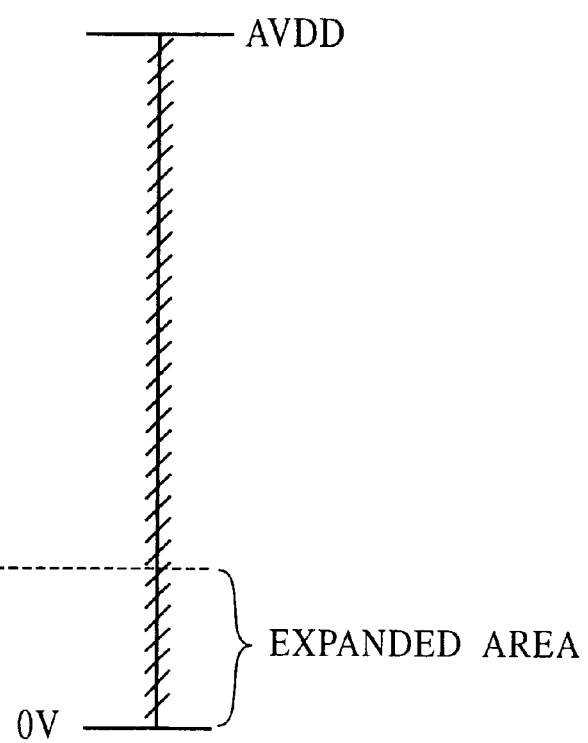

FIG. 14A shows the range of the input voltage of the voltage-current converter 1-1 in the amplifier device including no voltage-range compensation circuit 30. The amplifier device built-in the voltage-range compensation circuit 30 can expand the range of the input voltage supplied from the voltage-current converter 1-1, as shown in FIG. 14B. According to the amplifier device of the third embodiment, it is possible to reduce the power source voltage AVDD in a case that the range of the effective input voltage is same. This causes to decrease the power consumption of the amplifier device.

Fourth embodiment

Figure 15:
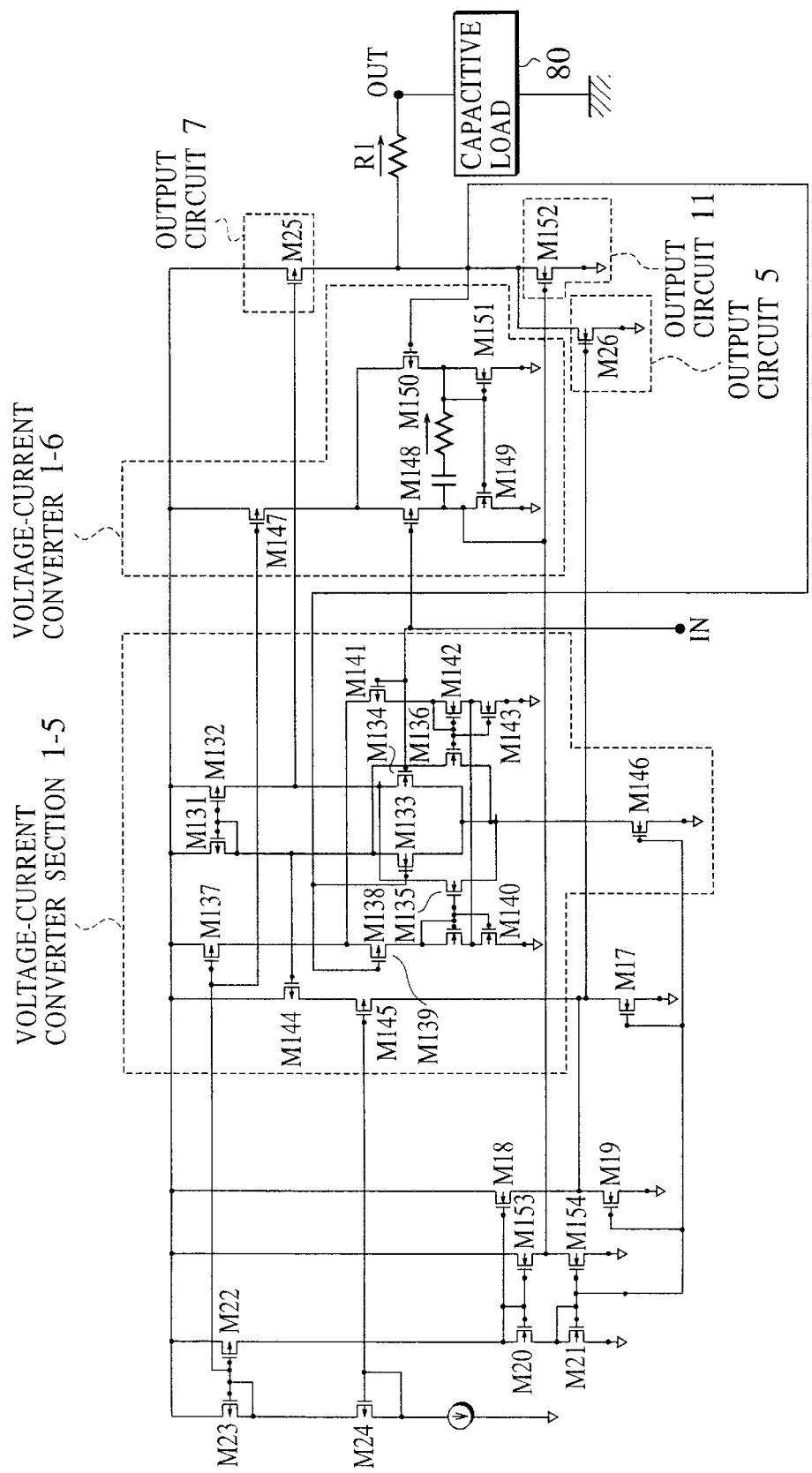
FIG. 15 is a circuit diagram showing a configuration of an amplifier device according to the fourth embodiment of the present invention.

FIG. 15 is a circuit diagram showing a configuration of the amplifier device according to the fourth embodiment of the present invention.

The amplifier device of the third embodiment shown in FIG. 13 has a voltage-current converter section comprising the voltage-current converter 1-1 and the voltage-range compensation circuit 30, the current-voltage converter 2 placed corresponding to the voltage-current converter 1-1, and the output circuit 5. On the other hand, the amplifier device of the fourth embodiment shown in FIG. 15 further comprises an additional voltage-current converter 1-6, an additional current-voltage converter made up of MOS transistors M153 and M154 provided corresponding to the voltage-current converter 1-6, and an additional output circuit 11 made up of a MOS transistor M152, in addition to the configuration of the amplifier device shown in FIG. 13 where the voltage-current converter section 1-5, the current-voltage converter made up of the MOS transistors M18 and M19, and the output circuit 5 are incorporated.

In the configuration of the amplifier device of the fourth embodiment, the voltage-current converter section 1-5 comprises MOS transistors M131, M132, M133, M134, M135, M136, M137, M138, M139, M140, M141, M142, M143, M144, M145, and M146. On the other hand, the voltage-current converter 1-6 comprises MOS transistors M147, M148, M149, M150, and M151. The output circuit 5 comprises the MOS transistor M26, the output circuit 7 comprises the MOS transistor M25, and the output circuit 11 comprises a MOS transistor M152.

Next, a description will be given of the amplifier device of the fourth embodiment.

The voltage-current conversion section 1-5 and the output circuit 5 can perform the same operation in the third embodiment shown in FIG. 13.

In the amplifier device of the fourth embodiment, the current output from the voltage-current converter 1-6 controls the gate voltage of the MOS transistor M152 forming the output circuit 11 in order to further discharge electrical charges from the capacitive load 80 through the output circuit 11 in addition to the output circuit 5 at a high speed.

That is, in the amplifier device of the fourth embodiment, because both the output circuit 5 and the output circuit 11 can discharge the electrical charges from the capacitive load 80, the discharging speed can be further increased.

Figure 16A:
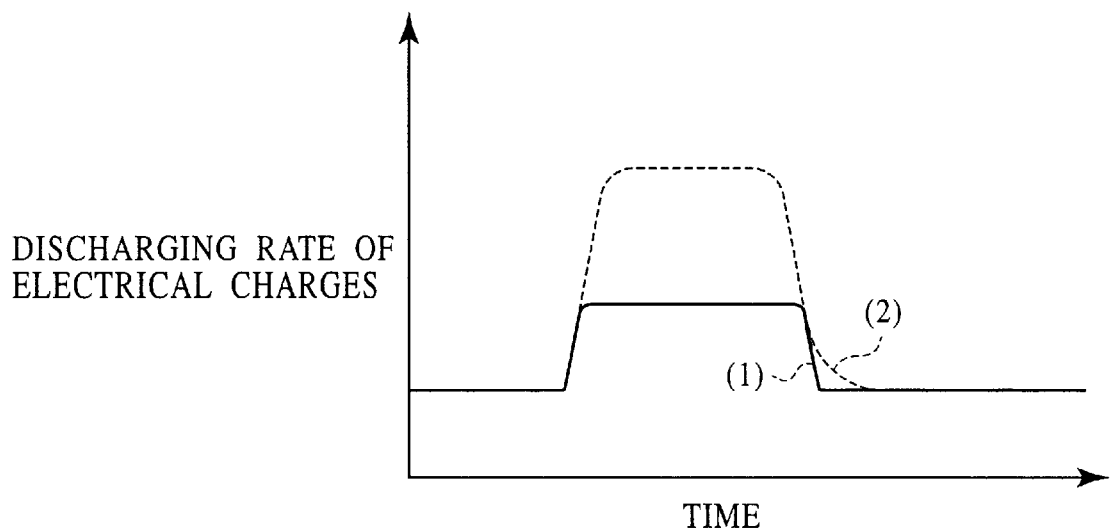
FIGS. 16A and 16B are diagrams, each showing a discharging characteristic of a current from a capacitive load in the amplifier device shown in FIG. 15.

Further, because both the MOS transistors M148 and M150 forming the differential pair in the voltage-current converter 1-6 are the same in polarity as the MOS transistor M25 forming the output circuit 7 for supplying electrical charges to the capacitive load 80, the characteristic of the electrical-charge discharging by the output circuit 11 has the function shown by reference character (1) in FIG. 16A.

Figure 16B:
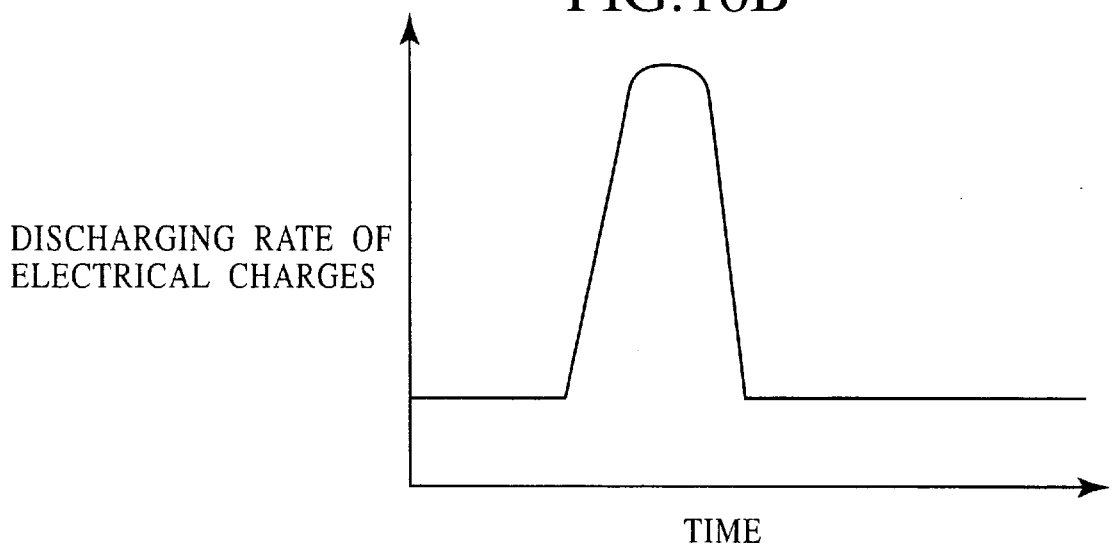

This characteristic of the output circuit 11 is different from the characteristic of the electrical-charge discharging of the output circuit 5 shown by reference character (2) in FIG. 16A In FIGS. 16A and 16B, the vertical axis indicates the discharging rate of electrical charges and the lateral axis indicates time.

FIG. 16B shows the total characteristic of the electrical-charge discharging of both the output circuits 5 and 11. As shown in FIG. 16B, the curve is dropped rapidly when compared with the curve shown in FIG. 16A. Thereby, even if the voltage difference detected by each of the differential amplifier stages in the voltage-current converter section 1-5 and the voltage-current converter 1-6 enters a small range, it is possible to drop rapidly the curve indicating the characteristic of the electrical-charge discharging of both the output circuits 5 and 11, and also to drop the voltage of the capacitive load 80 rapidly. This causes to raise the voltage of the capacitive load 80 rapidly to a desired level. It is thereby possible to obtain the characteristic suitable for high-speed operation.

As set forth in detail, according to the amplifier device of a preferred embodiment, the operation of the first output semiconductor element which discharges electrical charges accumulated in the capacitive load is controlled based on the positive output voltage from the amplifier stage (namely, the differential amplifier stage) in the voltage-current converter forming the amplifier device, and the operation of the second output semiconductor element which charges electrical charges to the capacitive load is controlled based on the negative output voltage from this amplifier stage. Further, because the current obtained from the voltage-current converter corresponding to the input signal voltage is converted to the voltage by the current-voltage converter in order to drive the first output semiconductor element, it is possible to drive the capacitive load of a large capacitance with a low power consumption at a high speed.

In addition, the operation of the switching MOS transistor which performs the ON/OFF operation for the output supplied from the current-voltage converter obtained based on the positive output voltage is controlled by the output from a control circuit whose operation is controlled based on the output voltage of the amplifier stage. Therefore it is possible to control the ON/OFF operation of the first output semiconductor element according to the level of the input signal voltage. In particularly, this control circuit comprises a ninth transistor outputting a current corresponding to the second polarity output voltage of the amplifier stage, and a second constant current source connected to a drain of the ninth transistor.

Furthermore, according to the amplifier device as a preferred embodiment, it is possible to set the voltage potential of the capacitive load to a desired level at high speed with any increasing of the power consumption based on the level of the input signal voltage by charging electrical charges to and discharging them from the capacitive load.

Moreover, according to the amplifier device as a preferred embodiment, because the level of the capacitive load can be set to a desired voltage level preciously, it is thereby possible to display image with stability when the capacitive load is a LC cell in the LCD device and to improve the quality of the image displayed on the LCD device.

In addition, according to the amplifier device as a preferred embodiment, there is a feature that the output current from the voltage-current converter is smaller than that of the constant current flowing from the constant current source when the input signal voltage to be input to the voltage-current converter is zero. Accordingly, when the level of the target voltage as the input signal voltage is more than zero, the current Iy from the voltage-current converter becomes Iy+ΔI (where, ΔI is an increment of the current Iy), and Iy+ΔI>I. This causes to increase the voltage of the gate (as a control terminal) of the first output semiconductor element, and the first output semiconductor element thereby enters ON to discharge electrical charges accumulated in the capacitive load. Thus, in order to increase the amount of the current the discharging operation, it is necessary only to increase the increment ΔI. Therefore, it can reduce the power consumption of the amplifier device.

Further, the voltage-current conversion device has a differential pair, and first to sixth transistors. The differential pair has a configuration in which first and second transistors are connected in differential connection. The gates of the third and fourth transistors are connected commonly, each source thereof is connected to a power source line, each drain thereof is connected to each corresponding drain of the first and second transistors. The gate of the fifth transistor is connected to the drain of one of the first and second transistors and converts the voltage obtained by the differential pair to a current. The drain of the sixth transistor is connected to the sources of both the first and second transistors and supplies a constant current to the differential pair.

Further, the amplifier device as a preferred embodiment has a feature in which the voltage-current conversion device further comprises a compensation circuit made up of a seventh MOS transistor, whose source is connected to the drain of the fifth MOS transistor, capable of suppressing a fluctuation of the output current. It is thereby possible to suppress the fluctuation caused during the conversion from the input signal voltage to the current and also possible to eliminate the variation of the control voltage (which is obtained by converting the above output current) for the first output semiconductor element. It is therefore possible to set the voltage potential of the capacitive load to a desired level preciously.

In addition, the amplifier device as a preferred embodiment has a feature in which the eighth MOS transistor is further incorporated between the differential pair and the sixth MOS transistor in cascade connection.

Furthermore, the amplifier device as a preferred embodiment has a feature in which a resistance for a phase compensation is provided on the path through which the electrical charges are discharged from the capacitive load by the first output semiconductor element.

Moreover, the amplifier device as a preferred embodiment has a feature in which a bypass section, which is different in a discharging-path from the first output semiconductor element, through which the electrical charges are discharged from the capacitive load. It is thereby possible to discharge the electrical charges accumulated in the capacitive load rapidly through the bypass section in addition to through the first output semiconductor element and possible to enhance the response ability of the capacitive load to the change of the input signal voltage.

In addition, the amplifier device as a preferred embodiment has a feature in which the bypass section is a pass that is connected directly to the capacitive load in order to discharge the electrical charges from the capacitive load. It is thereby possible to decrease an apparent threshold voltage of the MOS transistor forming the bypass section because the current flows from the capacitive load to the bypass section through this bypass, not through the resistance.

Further, the amplifier device as a preferred embodiment has a feature in which a resistance for phase compensation is provided on the path through which the electrical charges are discharged from the capacitive load by the first output semiconductor element. Moreover, the amplifier device as a preferred embodiment has a feature in which a capacitance for phase compensation placed between a gate of the second output semiconductor element and a common connection node of both the first and second output semiconductor elements. It is also possible to incorporate both the resistance and the capacitance for phase compensation.

In addition, the amplifier device as a preferred embodiment has a feature in which the amplifier stage is a differential amplifier stage having positive and negative input terminals, and the negative input terminal of the differential amplifier stage is connected to the common connection node of the first and second output semiconductor elements. Furthermore, the amplifier device as a preferred embodiment has a feature in which a voltage range compensation circuit expanding a range of the input signal voltage in same phase of the voltage-current conversion device is provided. The voltage range compensation circuit has a characteristic so that a part that is out of the range of the input signal voltage can be included. In addition, it is possible to decrease the level of the power source voltage so long as the range of the effective input voltage is not changed. This drop of the voltage can cause to reduce the power consumption.

Moreover, the amplifier as a preferred embodiment has a feature in which the following elements further comprises a second voltage-current conversion device, a second current-voltage conversion device, and a third output semiconductor element. The second voltage-current conversion device converts the input signal voltage to a corresponding current. The second current-voltage conversion device converts the current supplied from the second voltage-current conversion device to a corresponding voltage. The third output semiconductor element, whose operation is controlled by the voltage supplied from the second current-voltage conversion device, discharges the electrical charges from the capacitive load. It is thereby possible to set the voltage potential of the capacitive load to a desired level because the electrical charges accumulated in the capacitive load are discharged through both the first and third output semiconductor elements.

In addition, the liquid crystal display (LCD) device as a preferred embodiment has a source driver including the amplifier device of the present invention described above, a gate driver, a control section for transferring control signals to both the source driver and the gate driver in order to control the operation thereof, and a LCD section for displaying images based on output signals supplied from both the source driver and the gate driver. The LCD device can display images in quick response with low power consumption according to the input signal voltage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier device driving a capacitive load, comprising:
   a voltage-current conversion device comprising an amplifier stage amplifying an input signal voltage and a voltage-current conversion stage outputting a current corresponding to a first polarity output voltage of the amplifier stage;
   a current-voltage conversion device comprising a semiconductor element and a constant current source which are connected in series to each other, a current corresponding to the first polarity output voltage of the amplifier stage being supplied to a connection node between the semiconductor element and the constant current source, and the current-voltage conversion device outputting a voltage corresponding to the current supplied to the connection node from the voltage-current conversion device;
   a first output semiconductor element controlling a discharging operation to discharge electrical charges from the capacitive load based on the voltage output from the current-voltage conversion device according to the current corresponding to the first polarity output voltage of the amplifier stage; and
   a second output semiconductor element controlling a charging operation to supply electrical charges to the capacitive load based on a second polarity output voltage, which is different from the first polarity output voltage, of the amplifier stage.

2. The amplifier device according to claim 1, wherein the output current supplied from the voltage-current conversion device is smaller in magnitude than that of the constant current source when the magnitude of the input signal voltage supplied to the voltage-current conversion device is zero.

3. The amplifier device according to claim 1, wherein the voltage-current conversion device comprises:
   a differential pair having a configuration in which first and second transistors are connected in differential connection;
   third and fourth transistors whose gates are connected commonly, each source thereof being connected to a power source line, each drain thereof being connected to each corresponding drain of the first and second transistors;
   a fifth transistor whose gate is connected to the drain of one of the first and second transistors, converting a voltage obtained by the differential pair to a current; and
   a sixth transistor whose drain is connected to sources of both the first and second transistors, supplying a constant current to the differential pair.

4. The amplifier device according to claim 3, wherein the voltage-current conversion device further comprises a compensation circuit comprising a seventh transistor whose source is connected to a drain of the fifth transistor, the compensation circuit being capable of suppressing a fluctuation of the output current of the voltage-current conversion device.

5. The amplifier device according to claim 3, wherein the voltage-current conversion device further comprises an eighth transistor connected in cascade connection between the differential pair and the sixth transistor.

6. The amplifier device according to claim 1, wherein a resistance for a phase compensation is provided on a path through which the electrical charges are discharged from the capacitive load by the first output semiconductor element.

7. The amplifier device according to claim 1, further comprising a bypass section, which is different in a discharging-path from the first output semiconductor element, through which the electrical charges are discharged from the capacitive load.

8. The amplifier device according to claim 7, wherein the bypass section is a pass which is connected directly to the capacitive load in order to discharge the electrical charges from the capacitive load.

9. The amplifier device according to claim 1, further comprising a capacitance for a phase compensation placed between a gate of the second output semiconductor element and a common connection node of the first and second output semiconductor elements.

10. The amplifier device according to claim 1, wherein the amplifier stage is a differential amplifier stage having positive and negative input terminals, and the negative input terminal of the differential amplifier stage is connected to a common connection node of the first and second output semiconductor elements.

11. The amplifier device according to claim 1, further comprising a voltage range compensation circuit expanding a range of the input signal voltage in same phase of the voltage-current conversion device.

12. The amplifier device according to claim 1, further comprising:
   a second voltage-current conversion device converting the input signal voltage to a corresponding current;
   a second current-voltage conversion device converting the current supplied from the second voltage-current conversion device to a corresponding voltage; and
   a third output semiconductor element, whose operation is controlled by the voltage supplied from the second current-voltage conversion device, discharging the electrical charges from the capacitive load.

13. A liquid crystal display (LCD) device comprising:
   a source driver comprising the amplifier device according to claim 1;
   a gate driver;
   a control section transferring control signals to both the source driver and the gate driver in order to control the operation thereof; and
   a LCD section displaying images based on output signals supplied from both the source driver and the gate driver.

14. An amplifier device driving a capacitive load, comprising:

a voltage-current conversion device comprising an amplifier stage amplifying an input signal voltage and a voltage-current conversion stage outputting a current corresponding to a first polarity output voltage of the amplifier stage;

a current-voltage conversion device comprising a semiconductor element and a first constant current source which is connected in series to each other, a current corresponding to the first polarity output voltage of the amplifier stage being supplied to a connection node between the semiconductor element and the first constant current source through a switching transistor, and the current-voltage conversion device outputting a voltage corresponding to the current supplied to the connection node from the voltage-current conversion device according to an operation of the switching transistor;

a first output semiconductor element controlling a discharging operation to discharge electrical charges from the capacitive load based on the voltage output from the current-voltage conversion device according to the current corresponding to the first polarity output voltage of the amplifier stage;

a second output semiconductor element controlling a charging operation to supply electrical charges to the capacitive load based on an output voltage of the amplifier stage; and a control circuit controlling an operation of the switching transistor based on the output voltage of the amplifier stage.

15. The amplifier device according to claim 14, wherein the voltage-current conversion device comprises:

a differential pair having a configuration in which first and second transistors are connected in differential connection;

third and fourth transistors whose gates are connected commonly, each source thereof being connected to a power source line, each drain thereof being connected to each corresponding drain of the first and second transistors;

a fifth transistor whose gate is connected to the drain of one of the first and second transistors, converting a voltage obtained by the differential pair to a current; and a sixth transistor whose drain is connected to sources of both the first and second transistors, supplying a constant current to the differential pair.

16. The amplifier device according to claim 14, wherein the control circuit comprises:

a ninth transistor outputting a current corresponding to a second polarity output voltage, which is different from the first polarity output voltage, of the amplifier stage; and a second constant current source connected to a drain of the ninth transistor.

17. The amplifier device according to claim 14, wherein a resistance for a phase compensation is provided on a path through which the electrical charges are discharged from the capacitive load by the first output semiconductor element.

18. The amplifier device according to claim 14, further comprising a capacitance for a phase compensation placed between a gate of the second output semiconductor element and a common connection node of the first and second output semiconductor elements.

19. The amplifier device according to claim 14, wherein the amplifier stage is a differential amplifier stage having positive and negative input terminals, and the negative input terminal of the differential amplifier stage is connected to a common connection node of the first and second output semiconductor elements.

20. A liquid crystal display (LCD) device comprising:

a source driver comprising the amplifier device according to claim 14;

a gate driver;

a control section transferring control signals to both the source driver and the gate driver in order to control the operation thereof; and a LCD section displaying images based on output signals supplied from both the source driver and the gate driver.

* * * * *